United States Patent
Graf et al.

(10) Patent No.: US 8,173,980 B2
(45) Date of Patent: May 8, 2012

(54) GAS CLUSTER ION BEAM SYSTEM WITH CLEANING APPARATUS

(75) Inventors: Michael Graf, Belmont, MA (US); Andrej Mitrovic, Phoenix, AZ (US)

(73) Assignee: TEL Epion Inc., Billerica, MA (US)

( * ) Notice: Subject to any disclaimer, the term of this patent is extended or adjusted under 35 U.S.C. 154(b) by 239 days.

(21) Appl. No.: 12/774,050

(22) Filed: May 5, 2010

(65) Prior Publication Data

US 2011/0272593 A1    Nov. 10, 2011

(51) Int. Cl.
*A61N 5/00*    (2006.01)
(52) U.S. Cl. .................. 250/492.3; 250/423 R; 438/458
(58) Field of Classification Search ............... 250/492.3, 250/492.1, 424, 423 R; 438/458
See application file for complete search history.

(56) References Cited

U.S. PATENT DOCUMENTS

| | | | |
|---|---|---|---|
| 4,152,478 A | 5/1979 | Takagi | |
| 4,361,762 A | 11/1982 | Douglas | |
| 4,740,267 A | 4/1988 | Knauer et al. | |
| 4,886,971 A | 12/1989 | Matsumura et al. | |
| 4,916,311 A | 4/1990 | Fuzishita et al. | |
| 5,011,705 A * | 4/1991 | Tanaka | 427/534 |
| 6,135,128 A * | 10/2000 | Graf et al. | 134/1.1 |
| 6,218,207 B1 | 4/2001 | Itoh et al. | |
| 6,797,339 B2 | 9/2004 | Akizuki et al. | |
| 7,060,989 B2 | 6/2006 | Swenson et al. | |
| 7,173,252 B2 | 2/2007 | Mack | |
| 2002/0005676 A1 | 1/2002 | Greer | |
| 2002/0130275 A1 | 9/2002 | Mack et al. | |
| 2005/0155951 A1 | 7/2005 | Suzuki et al. | |
| 2006/0105570 A1 | 5/2006 | Hautala et al. | |
| 2006/0124934 A1 | 6/2006 | Fukumiya et al. | |
| 2007/0210366 A1 | 9/2007 | Sandhu et al. | |
| 2007/0224824 A1 | 9/2007 | Chen et al. | |
| 2008/0149826 A1 | 6/2008 | Renau et al. | |

(Continued)

FOREIGN PATENT DOCUMENTS

EP    2088613 A1    8/2009

(Continued)

OTHER PUBLICATIONS

European Patent Office, International Search Report and Written Opinion issued in related International Application No. PCT/US2011/035158 dated Jul. 27, 2011, 11 pp.

(Continued)

*Primary Examiner* — Phillip A Johnston
(74) *Attorney, Agent, or Firm* — Wood, Herron & Evans, LLP

(57) ABSTRACT

A processing system is provided for irradiating a substrate with a gas cluster ion beam (GCIB). The system includes a vacuum vessel that has an interior and is configured to support the substrate therein, and at least one nozzle for forming and emitting a gas cluster beam. The at least one nozzle is configured to direct the gas cluster beam within the vacuum vessel toward the substrate. An ionizer is positioned to ionize the gas cluster beam to form the GCIB. A main gas supply of the system is in fluid communication with the at least one nozzle for supplying gas to the nozzle. The system also includes a plasma-generating apparatus that communicates with the interior of the vacuum vessel and which is configured to receive a cleaning gas and selectively emit plasma for cleaning the interior of the vacuum vessel.

17 Claims, 19 Drawing Sheets

U.S. PATENT DOCUMENTS

2009/0152629 A1 6/2009 Hu et al.
2009/0314954 A1* 12/2009 Hautala et al. .............. 250/424
2010/0193472 A1 8/2010 Tabat et al.

FOREIGN PATENT DOCUMENTS

| JP | 62296357 A | 12/1987 |
|---|---|---|
| JP | 06275545 | 9/1994 |
| WO | 0170378 A1 | 9/2001 |

OTHER PUBLICATIONS

Park et al., Evolution of Residual Stress in Plasma-enhanced Chemical-Vapor-Deposited Silicon Dioxide Film Exposed to Room Air, Applied Physics Letters, Dec. 13, 1999, pp. 3811-3813, vol. 75, No. 24.

Nguyen, S. V., High-density Plasma Chemical Vapor Deposition of Silicon-based Dielectric Films for Integrated Circuits, J. Res. Develop., Jan./Mar. 1999, pp. 109-126, vol. 43, No. 1/2.

Witvrouw et al, A Comparison Between Wet HF Etching and Vapor HF Etching for Sacrificial Oxide Removal, SPIE vol. 4174 (2000), pp. 130-141.

Hautala, J., et al., "Infusion Processing: An Alternative to Plasma Technology for Semiconductor Device Manufacturing", Proceedings of the Electrochemical Society, Symposium on ULSI Process Integration IV (Quebec PR, Canada, May 16-20, 2005), 2005, vol. 6, pp. 118-130.

Shao et al., "Nitrogen gas-cluster ion beam—A new nitrogen source for GaN growth", Mat. Res. Soc. Symp. Proc., 2003, vol. 743, pp. 97-102.

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).

Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.

Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

Baker, S.H. et al., The construction of a gas aggregation source for the preparation of size-selected nanoscale transition metal clusters; Review of Scientific Instruments, AIP, Aug. 1, 2000, pp. 3178-3183, vol. 71, No. 8, XP012038462, ISSN: 0034-6748, Melville, NY.

* cited by examiner

GAS CLUSTER ION BEAM SYSTEM WITH CLEANING APPARATUS

CROSS-REFERENCE TO RELATED APPLICATIONS

This application is related to co-pending U.S. Nonprovisional patent application Ser. No. 12/428,945, entitled "MULTIPLE NOZZLE GAS CLUSTER ION BEAM SYSTEM" (Ref. No. EP-166), filed Apr. 23, 2009, which is based on and claims the benefit of and priority to U.S. Provisional Patent Application No. 61/149,930, entitled "MULTIPLE NOZZLE GAS CLUSTER ION BEAM SYSTEM AND A METHOD OF OPERATION" (Ref. No. EP-166 PROV), filed on Feb. 4, 2009. This application is also related to co-pending U.S. Nonprovisional patent application Ser. No. 12/774,051, entitled "GAS CLUSTER ION BEAM SYSTEM WITH RAPID GAS SWITCHING APPARATUS," (Ref. No. EP-173) filed on even date herewith. The entire contents of all of these applications are hereby expressly incorporated by reference herein in their entirety.

BACKGROUND OF THE INVENTION

1. Field of the Invention

The invention relates to a system and related methods for irradiating substrates using a gas cluster ion beam (GCIB) and, more particularly, to systems having a cleaning apparatus to remove contamination from such systems.

2. Description of Related Art

Gas cluster ion beams (GCIB's) are used for doping, etching, cleaning, smoothing, and growing or depositing layers on a substrate. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion. The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Known GCIB systems of the type described above include a vacuum vessel within which the substrate is irradiated with the cluster ion beam. Over time, such irradiation has been observed to result in the accumulation of contaminants on the interior surfaces of the vacuum vessel. These contaminants may be the result of diverging cluster ion beams that do not reach the substrate, but instead reach interior surfaces of the vacuum vessel, or surfaces of the GCIB system components internal to the vacuum vessel. If those contaminants are left on these surfaces, they may eventually flake off, thereby contaminating the substrate doping, etching, cleaning, smoothing, layer-growing, or layer-depositing GCIB operation.

A need therefore exists for an apparatus and related methods to easily clean the interior surfaces of components of GCIB processing systems.

SUMMARY OF THE INVENTION

In one embodiment, a processing system is provided for irradiating a substrate with a gas cluster ion beam (GCIB). The system includes a vacuum vessel that has an interior and is configured to support the substrate therein, and at least one nozzle for forming and emitting a gas cluster beam. The at least one nozzle is configured to direct the gas cluster beam within the vacuum vessel toward the substrate. An ionizer is positioned downstream of the at least one nozzle for ionizing the gas cluster beam to form the GCIB. A main gas supply of the system is in fluid communication with the at least one nozzle for supplying gas to the nozzle. The system also includes a plasma-generating apparatus that communicates with the interior of the vacuum vessel and which is configured to receive a cleaning gas and selectively emit plasma for cleaning the interior of the vacuum vessel.

In another embodiment, a processing system is provided for irradiating a substrate with a gas cluster ion beam (GCIB). The system comprises a vacuum vessel that has an interior and is configured to support the substrate therein, and a pressure cell chamber for modifying an energy distribution of the GCIB. The system includes at least one nozzle for forming and emitting a gas cluster beam, and which is configured to direct the gas cluster beam within the vacuum vessel toward the substrate. An ionizer is positioned downstream of the at least one nozzle for ionizing the gas cluster beam to form the GCIB. A gas supply is in fluid communication with the at least one nozzle for supplying gas to the nozzle. The system also includes an inductively coupled plasma (ICP) generator that is in communication with the pressure cell chamber. The ICP generator includes a dielectric tube that is configured to receive the cleaning gas and to selectively emit the plasma. The ICP generator also has an induction coil that extends around the dielectric tube, and which is effective to excite cleaning gas molecules in the dielectric tube to thereby generate the plasma. Emission of the plasma is effective to clean an interior of the pressure cell chamber and surfaces adjacent to that chamber.

In yet another embodiment, a method is provided for cleaning an interior of a vacuum vessel of a processing system for irradiating a substrate with a gas cluster ion beam (GCIB). The processing system includes at least one nozzle for forming and emitting a gas cluster beam, and an ionizer positioned in the interior, downstream of the at least one nozzle, for ionizing the gas cluster beam to form the GCIB. The method includes supplying a cleaning gas to a plasma-generating apparatus fluidly coupled to the interior, and actuating the plasma-generating apparatus to thereby excite molecules of the cleaning gas that is supplied to the plasma-generating apparatus, which in turn generates the plasma. The method includes directing the plasma generated by the plasma-generating apparatus into the interior adjacent to or downstream of the ionizer such that the plasma is effective to clean the interior of the vacuum vessel.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIGS. 10A-12B are cross-sectional views of various embodiments of the multiple nozzle assembly depicting various arrangements of multiple nozzles, and having various gas skimmer cross-sectional shapes to accommodate the various nozzle arrangements.

DETAILED DESCRIPTION OF EXEMPLARY EMBODIMENTS

In the following description, in order to facilitate a thorough understanding of the invention and for purposes of explanation and not limitation, specific details are set forth, such as a particular geometry of the metrology system and descriptions of various components and processes. However, it should be understood that the invention may be practiced in other embodiments that depart from these specific details.

Figure 1:
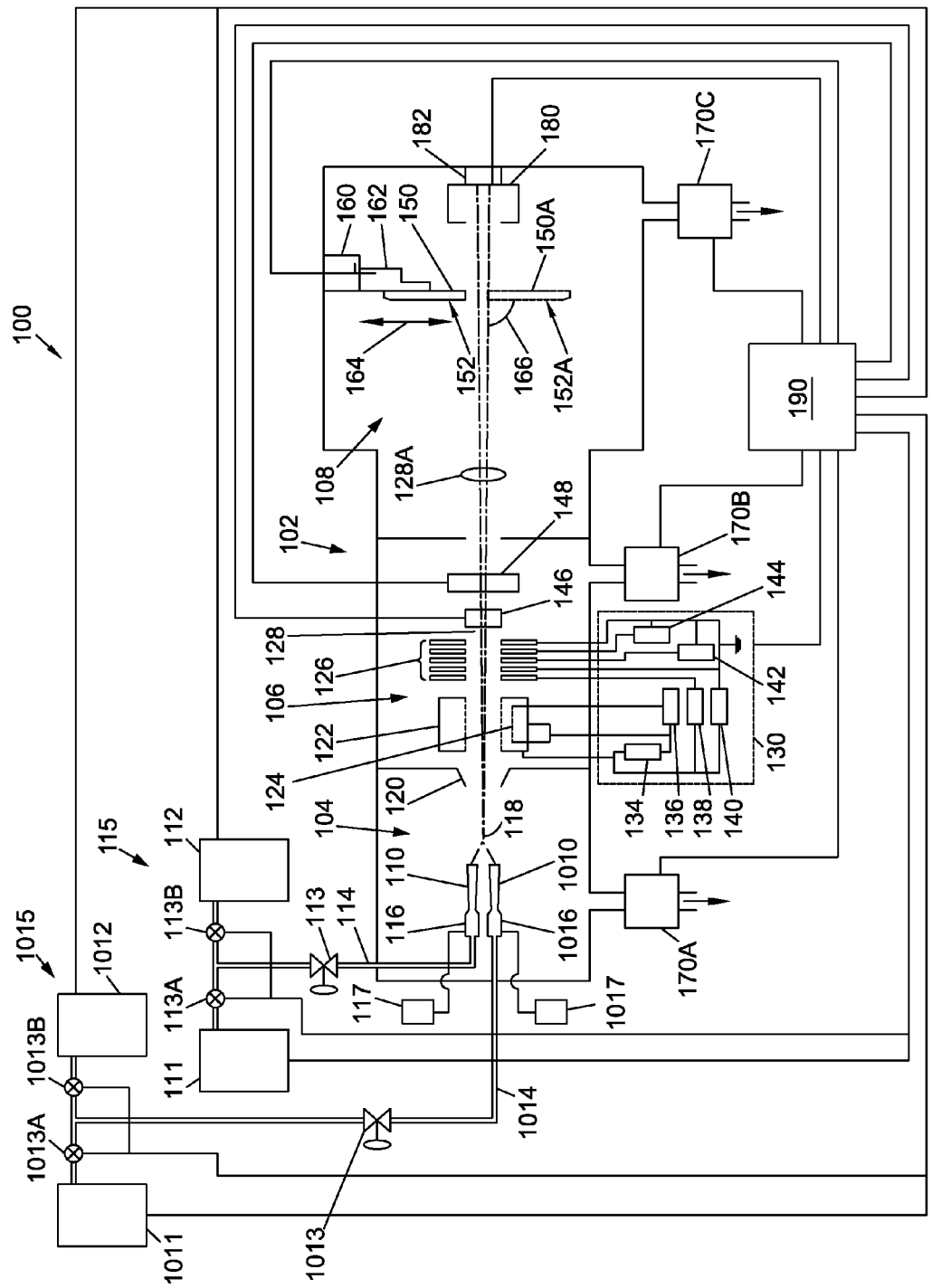
FIG. 1 is a schematic representation of a multiple nozzle GCIB system in accordance with an embodiment of the invention.

Referring now to FIG. 1, a GCIB processing system 100 for modifying, depositing, growing, or doping a layer is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 1, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

In the exemplary embodiment of FIG. 1, GCIB processing system 100 comprises two gas supplies 115, 1015 and two nozzles 110, 1010. Additional embodiments will be discussed later having numbers of nozzles different than two, and numbers of gas supplies different than two, all of which fall within the scope of the invention. Each of the two gas supplies 115 and 1015 is connected to one of two stagnation chambers 116 and 1016, and nozzles 110 and 1010, respectively. The first gas supply 115 comprises a first gas source 111, a second gas source 112, a first gas control valve 113A, a second gas control valve 113B, and a gas metering valve 113. For example, a first gas composition stored in the first gas source 111 is admitted under pressure through a first gas control valve 113A to the gas metering valve or valves 113. Additionally, for example, a second gas composition stored in the second gas source 112 is admitted under pressure through the second gas control valve 113B to the gas metering valve or valves 113. Further, for example, the first gas composition or second gas composition, or both, of first gas supply 115 can include a condensable inert gas, carrier gas or dilution gas. For example, the inert gas, carrier gas or dilution gas can include a noble gas, i.e., He, Ne, Ar, Kr, Xe, or Rn.

Similarly, the second gas supply 1015 comprises a first gas source 1011, a second gas source 1012, a first gas control valve 1013A, a second gas control valve 1013B, and a gas metering valve 1013. For example, a first gas composition stored in the first gas source 1011 is admitted under pressure through the first gas control valve 1013A to the gas metering valve or valves 1013. Additionally, for example, a second gas composition stored in the second gas source 1012 is admitted under pressure through the second gas control valve 1013B to the gas metering valve or valves 1013. Further, for example, the first gas composition or second gas composition, or both, of second gas supply 1015 can include a condensable inert gas, carrier gas or dilution gas. For example, the inert gas, carrier gas or dilution gas can include a noble gas, i.e., He, Ne, Ar, Kr, Xe, or Rn.

Furthermore, the first gas sources 111 and 1011, and the second gas sources 112 and 1012 are each utilized to produce ionized clusters. The material compositions of the first and second gas sources 111, 1011, 112, and 1012 include the principal atomic (or molecular) species, i.e., the first and second atomic constituents desired to be introduced for doping, depositing, modifying, or growing a layer.

The high pressure, condensable gas comprising the first gas composition and/or the second gas composition is introduced from the first gas supply 115 through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and a gas cluster beam emanates from nozzle 110.

Similarly, the high pressure, condensable gas comprising the first gas composition and/or the second gas composition is introduced from the second gas supply 1015 through gas feed tube 1014 into stagnation chamber 1016 and is ejected into the substantially lower pressure vacuum through a properly shaped nozzle 1010. As a result of the expansion of the high pressure, condensable gas from the stagnation chamber 1016 to the lower pressure region of the source chamber 104, the gas velocity accelerates to supersonic speeds and a gas cluster beam emanates from nozzle 1010.

Nozzles 110 and 1010 are mounted in such close proximity that the individual gas cluster beams generated by the nozzles 110, 1010 substantially coalesce in the vacuum environment of source chamber 104 into a single gas cluster beam 118 before reaching the gas skimmer 120. The chemical composition of the gas cluster beam 118 represents a mixture of compositions provided by the first and second gas supplies 115 and 1015, injected via nozzles 110 and 1010.

The inherent cooling of the jet as static enthalpy is exchanged for kinetic energy, which results from the expansion in the jets, causes a portion of the gas jets to condense and form a gas cluster beam 118 having clusters, each consisting of from several to several thousand weakly bound atoms or molecules. A gas skimmer 120, positioned downstream from the exit of nozzles 110 and 1010 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

The first and second gas supplies 115 and 1015 can be configured to independently control stagnation pressures and temperatures of gas mixtures introduced to stagnation chambers 116 and 1016. Temperature control can be achieved by the use of suitable temperature control systems (e.g. heaters and/or coolers) in each gas supply (not shown). In addition, a manipulator 117 may be mechanically coupled to nozzle 110, for example via the stagnation chamber 116, the manipulator 117 being configured to position the coupled nozzle 110 with respect to the gas skimmer 120, independent of nozzle 1010.

Likewise, a manipulator 1017 may be mechanically coupled to nozzle 1010, for example via the stagnation chamber 1016, the manipulator 1017 being configured to position the coupled nozzle 1010 with respect to the gas skimmer 120, independent of nozzle 110. Thus each nozzle in a multi-nozzle assembly may be separately manipulated for proper positioning vis-à-vis the single gas skimmer 120.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 1, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 1, the beam electronics 130 further include an anode power supply 134 that provides voltage $V_A$ to an anode of ionizer 122 for accelerating electrons emitted from ionizer filament 124 and causing the electrons to bombard the gas clusters in gas cluster beam 118, which produces cluster ions.

Additionally, as illustrated in FIG. 1, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{Acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered processing GCIB 128A that enters the processing chamber 108. In one embodiment, the beam filter 146 substantially reduces the number of clusters having 100 or less atoms or molecules or both. The beam filter 146 may comprise a magnet assembly for imposing a magnetic field across the GCIB 128 to aid in the filtering process.

Referring still to FIG. 1, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define processing GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the processing GCIB 128A in the processing chamber 108. Because most applications contemplate the processing of large substrates with spatially uniform results, a scanning system may be desirable to uniformly scan the processing GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through processing GCIB 128A to cause a uniform (or otherwise programmed) irradiation of a surface of the substrate 152 by the processing GCIB 128A for processing of the substrate 152.

The substrate holder 150 disposes the substrate 152 at an angle with respect to the axis of the processing GCIB 128A so that the processing GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the processing GCIB 128A, and in both extreme positions, is moved completely out of the path of the processing GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the processing GCIB 128A so as to intercept a sample of the processing GCIB 128A when the substrate holder 150 is scanned out of the path of the processing GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 1, control system 190 connects to the X-scan actuator 160 and the Y-scan actuator 162 through electrical cable and controls the X-scan actuator 160 and the Y-scan actuator 162 in order to place the substrate 152 into or out of the processing GCIB 128A and to scan the substrate 152 uniformly relative to the processing GCIB 128A to achieve desired processing of the substrate 152 by the processing GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the processing GCIB 128A when a predetermined dose has been delivered.

Figure 2:
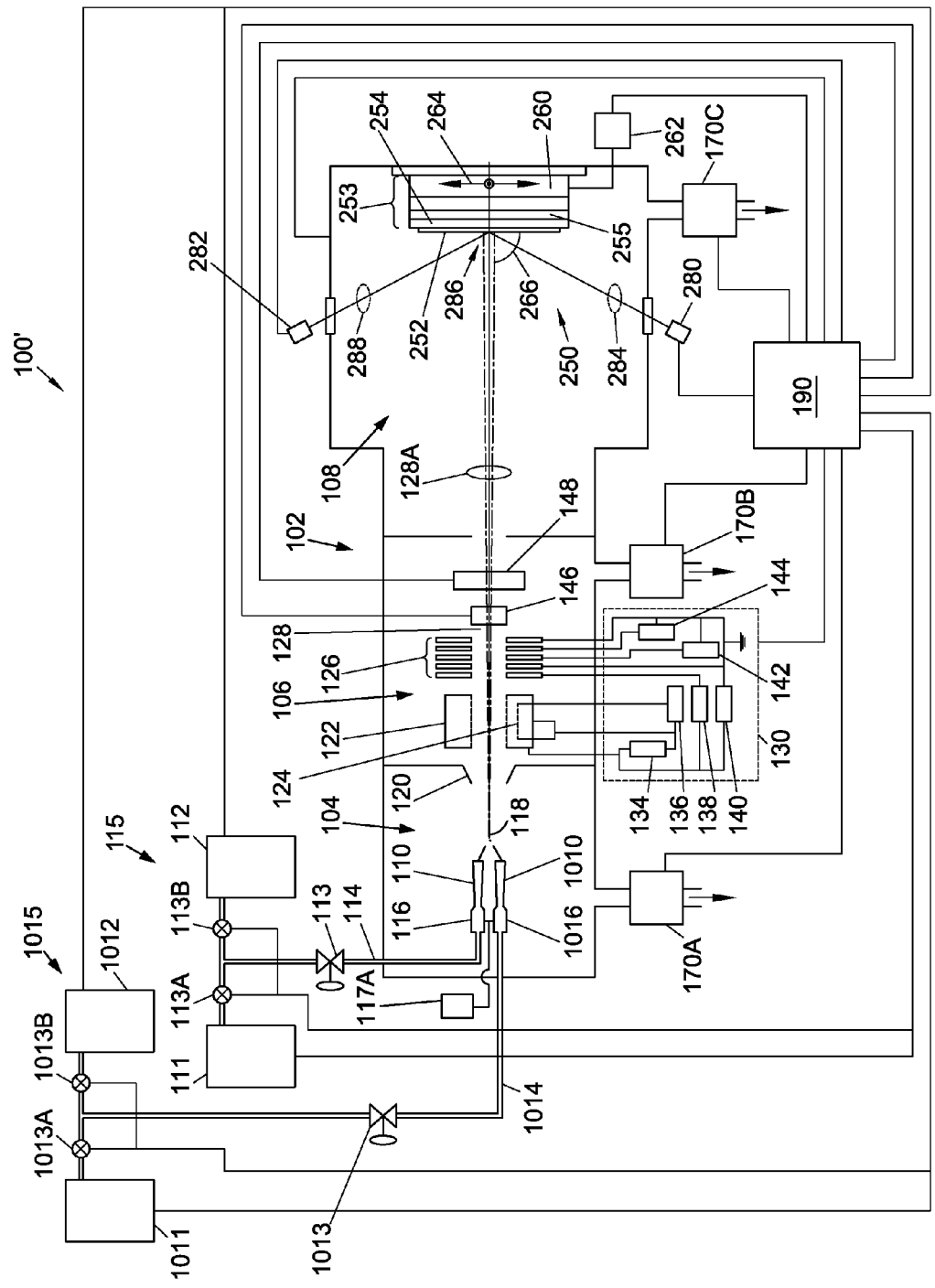
FIG. 2 is a schematic representation of a multiple nozzle GCIB system in accordance with another embodiment of the invention.

In the embodiment shown in FIG. 2, the GCIB processing system 100' can be similar to the embodiment of FIG. 1 and further comprise a X-Y positioning table 253 operable to hold and move a substrate 252 in two axes, effectively scanning the substrate 252 relative to the processing GCIB 128A. For example, the X-motion can include motion into and out of the plane of the paper, and the Y-motion can include motion along direction 264.

The processing GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of processing GCIB 128A so that every region of the surface may be made to coincide with the projected impact region 286 for processing by the processing GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the processing GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging processing GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the processing GCIB 128A. In such case, a Faraday cup (not shown, but which may be similar to beam current sensor 180 in FIG. 1) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the processing GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the processing GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 3:
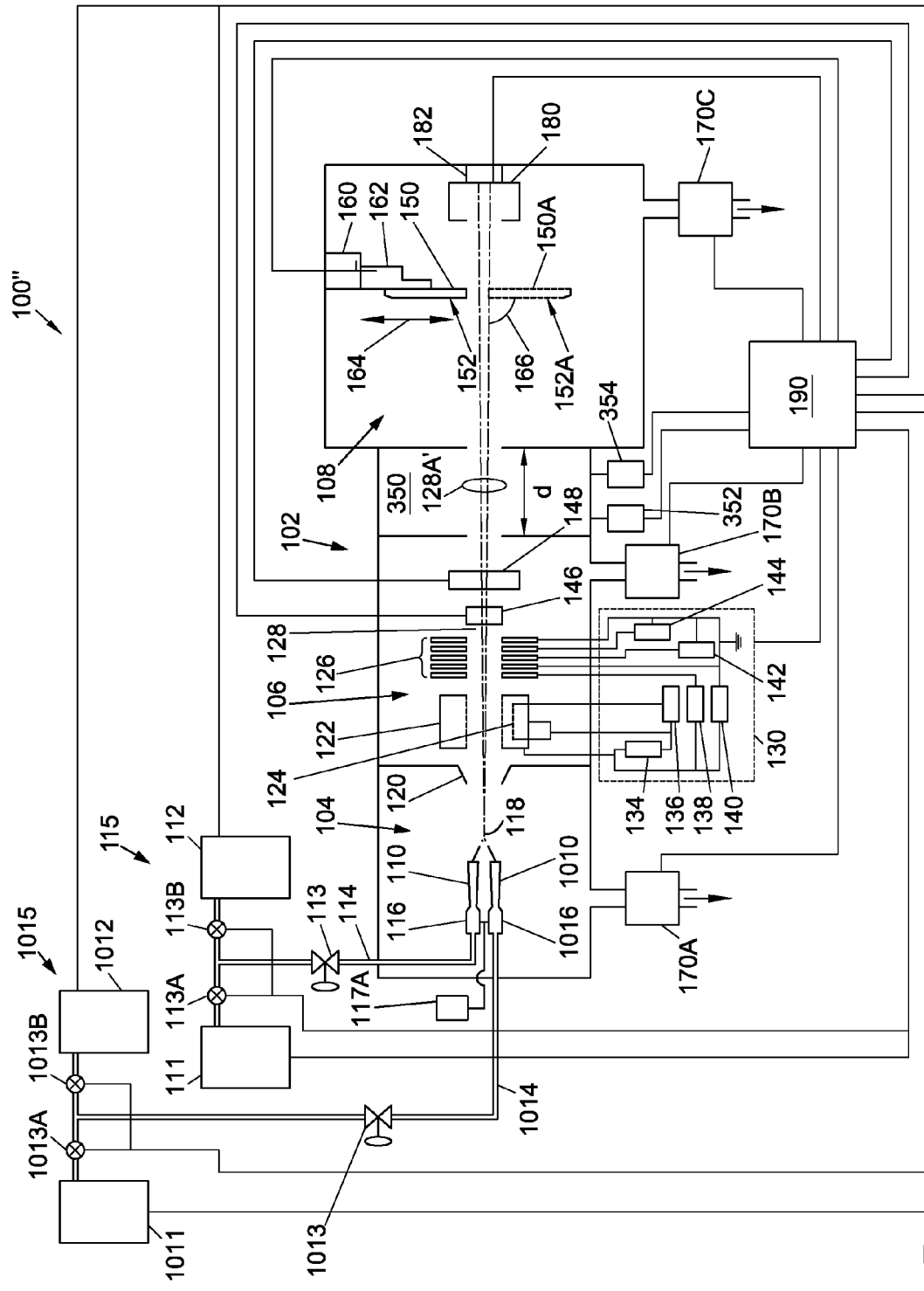
FIG. 3 is a schematic representation of a multiple nozzle GCIB system in accordance with yet another embodiment of the invention.

In the embodiment shown in FIG. 3, the GCIB processing system 100" can be similar to the embodiment of FIG. 1 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled METHOD AND APPARATUS FOR IMPROVED PROCESSING WITH A GAS-CLUSTER ION BEAM; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas sources 111 and 1011, second gas sources 112 and 1012, first gas control valves 113A and 1013A, second gas control valves 113B and 1013B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Also shown in FIGS. 2 and 3 is an alternative embodiment for a nozzle manipulator. Rather than each nozzle 110, 1010 being coupled to a separately operable manipulator 117, 1017 as in FIG. 1, the nozzles 110, 1010 may be coupled to each other, and together coupled to a single manipulator 117A. The position of the nozzles 110, 1010 vis-à-vis the gas skimmer 120 can then be manipulated collectively as a set rather than individually.

Figure 4:
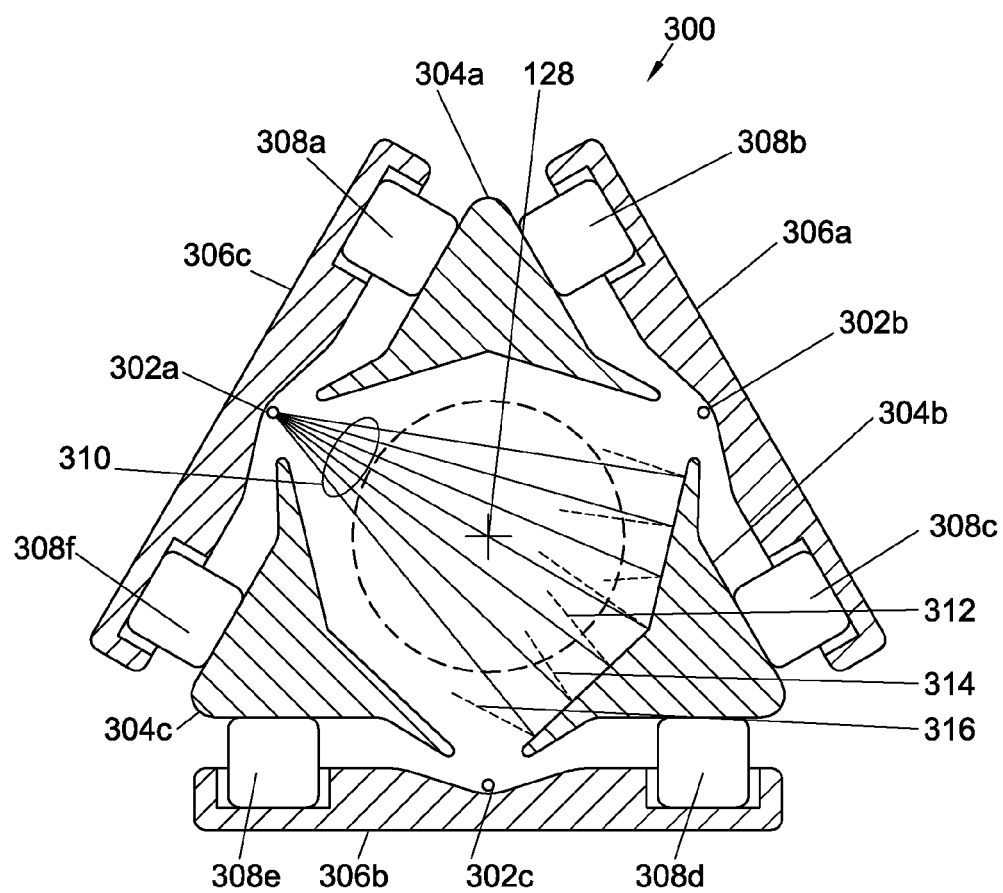
FIG. 4 is a schematic representation of an embodiment of an ionizer for use in a GCIB system.

Referring now to FIG. 4, a section 300 of a gas cluster ionizer (122, FIGS. 1, 2 and 3) for ionizing a gas cluster jet (gas cluster beam 118, FIGS. 1, 2 and 3) is shown. The section 300 is normal to the axis of GCIB 128. For typical gas cluster sizes (2000 to 15000 atoms), clusters leaving the gas skimmer aperture (120, FIGS. 1, 2 and 3) and entering an ionizer (122, FIGS. 1, 2 and 3) will travel with a kinetic energy of about 130 to 1000 electron volts (eV). At these low energies, any departure from space charge neutrality within the ionizer 122 will result in a rapid dispersion of the jet with a significant loss of beam current. FIG. 4 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar. For example, the ionizer design may be similar to the ionizer described in U.S. Pat. No. 7,173,252, entitled IONIZER AND METHOD FOR GAS-CLUSTER ION-BEAM FORMATION; the content of which is incorporated herein by reference in its entirety.

The gas cluster ionizer (122, FIGS. 1, 2 and 3) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Figure 5:
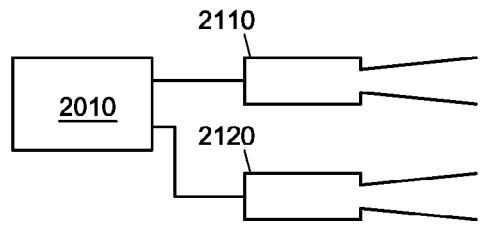
FIGS. 5-9 are schematic representations of various embodiments of the multiple nozzle assembly, comprising multiple nozzles, single or multiple gas supplies, and having various gas flow interconnections provided therebetween.

With reference now to FIGS. 5-9, therein are depicted various embodiments of the multiple nozzle and gas supply assembly of GCIB processing system 100 (or 100', 100") of FIGS. 1, 2, and 3, respectively. FIG. 5 depicts an embodiment of a multiple nozzle and gas supply assembly comprising a single gas supply 2010 and two nozzles 2110 and 2120, fed by gas supply 2010. Like, for example, the first gas supply 115 of GCIB processing system 100 of FIG. 1, gas supply 2010 (and all other gas supplies of FIGS. 5-9) may comprise a first gas source, a second gas source, a first gas control valve, a second gas control valve, and a gas metering valve to allow the formation of a gas mixture composed of gases provided by the first and second gas sources, or alternatively to flow only one gas from the first or second gas source. The multiple nozzle and gas supply assembly of FIG. 5 is suitable for GCIB applications where a large gas flow is required of a single gas or gas mixture, necessitating the use of multiple nozzles, so identical or similar stagnation conditions (i.e. pressure and temperature) can be maintained inside stagnation chambers preceding the nozzles, and identical or similarly-sized nozzles can be utilized as those in a prior art single gas supply and single nozzle GCIB system.

Figure 6:
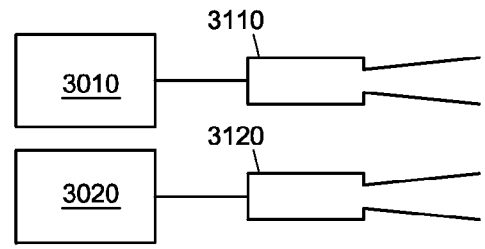

FIG. 6 depicts essentially the embodiment of the multiple nozzle and gas supply assembly of GCIB processing system 100 (or 100', 100") of FIGS. 1, 2, and 3, respectively. The assembly of FIG. 6 comprises two gas supplies 3010 and 3020, and two gas nozzles 3110 and 3120, allowing its use in GCIB applications requiring the formation of gas cluster beams composed of mixtures of incompatible gases and/or pyrophoric gases. Such incompatible gas mixtures cannot be readily premixed in a single gas supply (e.g. gas supply 2010 of FIG. 5) for injection via a single or multiple nozzles, due to at least adverse chemical reactions that would occur between the incompatible gas mixture components inside the parts and piping of the single gas supply. The multiple nozzle and gas supply assembly of FIG. 6 overcomes this issue by providing independent gas supplies 3010, 3020 for the incompatible and/or pyrophoric gas mixture components, which are only mixed upon injection from nozzles 3110 and 3120 mounted in mutual close proximity so as to at least partially coalesce and produce a single gas cluster beam. A further advantage is that different dilution gases may be used in the different gas mixtures, for example, a first gas mixture may use He as a dilution gas, while a second gas mixture may use Ar. It is also possible to configure gas supplies 3010 and 3020 of the multiple nozzle and gas supply system of FIG. 6 to flow gas mixtures of the same composition to nozzles 3110 and 3120. Furthermore, the multiple nozzle and gas supply assembly of FIG. 6 allows the injection of gas mixtures at different stagnation pressures and/or temperatures, from nozzles 3110 and 3120, for example, if optimum cluster nucleation conditions of gas mixtures are different, and therefore require different stagnation conditions. Stagnation pressure control is achieved generally by setting the gas metering valve of a gas supply, while stagnation temperature control may be achieved by the use of suitable heaters or cooling devices (not shown).

Figure 7:
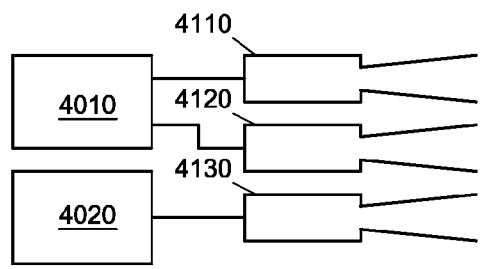
Figure 8:
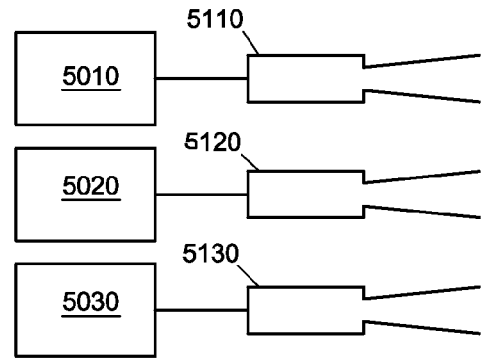
Figure 9:
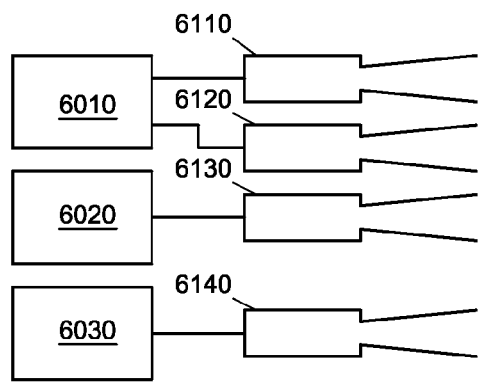

FIG. 7 depicts a multiple nozzle and gas supply assembly similar to that of FIGS. 5 and 6 combined, comprising gas supplies 4010 and 4020, and three nozzles 4110, 4120, and 4130, wherein gas supply 4010 supplies two nozzles, 4110 and 4120 respectively, allowing higher flow rates of one gas mixture, while gas supply 4020 supplies only nozzle 4130. This configuration is suitable for applications requiring high flow rates of one gas mixture component, while retaining the ability to handle incompatible and/or pyrophoric gases. FIG. 8 depicts a similar embodiment to that of FIG. 6, extended to comprise three gas supplies 5010, 5020, and 5030, and three nozzles 5110, 5120, and 5130, allowing independent introduction of three different gas mixtures to the nozzles, if a GCIB process so requires. FIG. 9 depicts a similar assembly to that of FIGS. 5 and 8 combined, comprising three gas supplies 6010, 6020, and 6030, and four nozzles 6110, 6120, 6130, and 6140, wherein gas supply 6010 is connected to nozzles 6110 and 6120, allowing high gas mixture flow rates therethrough, with the ability to independently provide an additional two gas mixture components.

While embodiments of FIGS. 5-9 can, as process conditions may demand, be set to simultaneously flow multiple gases or gas mixtures to the individual nozzles, it is also possible to operate the multiple gas supplies and nozzles in a sequential manner, wherein in a sequence of process steps, at least one step is used that involves simultaneously flowing multiple gases or gas mixtures. For example, in the embodiment of FIG. 6, a first GCIB process step may involve flowing only a single gas or gas mixture, generated by gas supply 3010, and introduced via nozzle 3110, and a second process step may involve first and second gases or gas mixtures, generated by gas supplies 3010 and 3020, and introduced via nozzles 3110 and 3120, respectively.

It is immediately apparent that other embodiments of the multiple nozzle and gas supply assembly are possible, comprising different numbers of nozzles (e.g. higher than four), and different numbers of gas supplies (e.g. higher than three) some of which may be connected to multiple nozzles to accommodate high flow rates, all of which embodiments fall within the scope of the invention.

FIGS. 10A-12B are cross-sectional schematics depicting various spatial arrangements of multiple nozzles, and various cross-sectional shapes of a single gas skimmer to be used with a particular nozzle arrangement. The mutual close proximity of nozzles within the assembly ensure that the individual gas cluster beams leaving the nozzles substantially or at least partially coalesce into a single gas cluster beam before reaching the gas skimmer. The coalescence of gas cluster beams into a single gas cluster beam before reaching the gas skimmer allows the use of same GCIB system components downstream of the gas skimmer as in a prior art single gas supply and single nozzle GCIB system. Given that these downstream components may be the same, it is envisioned that an existing GCIB system can be converted into a multi-nozzle system, with multiple gas supplies, with relatively little modification and/or parts replacement, primarily in the source chamber area of a GCIB system.

Figures 10A, 10B, 10C:
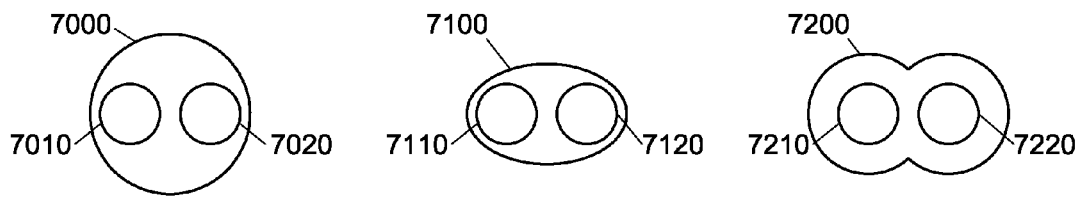
Figures 11A, 11B:
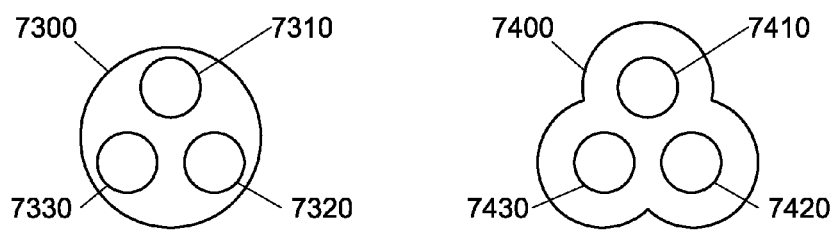
Figures 12A, 12B:
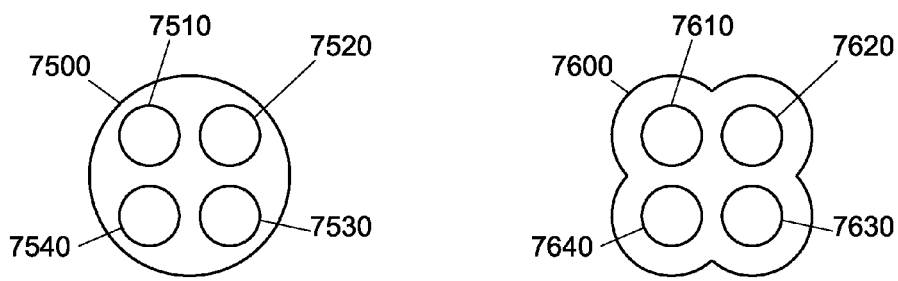

FIG. 10A depicts a multiple nozzle assembly comprising two nozzles 7010 and 7020, seen in cross section, mounted side by side (or alternatively oriented vertically one above the other) forming a gas cluster beam which passes through a gas skimmer 7000 of substantially circular cross section. FIG. 10B depicts a similar dual nozzle assembly with an oval or elliptical gas skimmer 7100, aligned with nozzles 7110 and 7120. FIG. 10C depicts a dual nozzle assembly with a twin lobed gas skimmer 7200, aligned with nozzles 7210 and 7220. The embodiments of FIGS. 10A-C can readily be extended to assemblies with larger numbers of nozzles. For example, FIG. 11A depicts an assembly with three nozzles 7310, 7320, and 7330 injecting a gas cluster beam through a substantially circular gas skimmer 7300. FIG. 11B depicts a similar three-nozzle assembly, but with a three-lobed gas skimmer 7400, aligned with the nozzles 7410, 7420, and 7430. In similar vein, FIGS. 12A-B extend the concept to an assembly with four nozzles 7510, 7520, 7530 and 7540, and four nozzles 7610, 7620, 7630 and 7640, respectively, injecting a gas cluster beam through a substantially circular gas skimmer 7500 and four-lobed gas skimmer, 7600, respectively. Other embodiments can be readily envisioned, all of which fall within the scope of the invention.

Figure 13A:
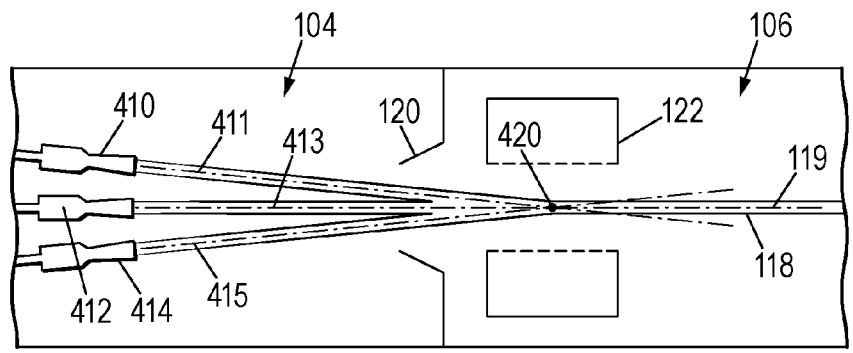
FIG. 13A-D are schematic representations of various embodiments of a multiple nozzle assemblies with nozzles mounted at an inwards pointing angle such that gas cluster beams intersect at a point along the main GCIB axis.
Figure 13B:
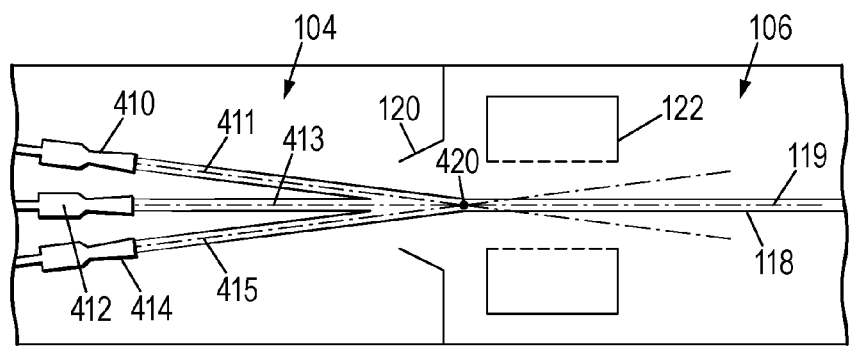
Figure 13C:
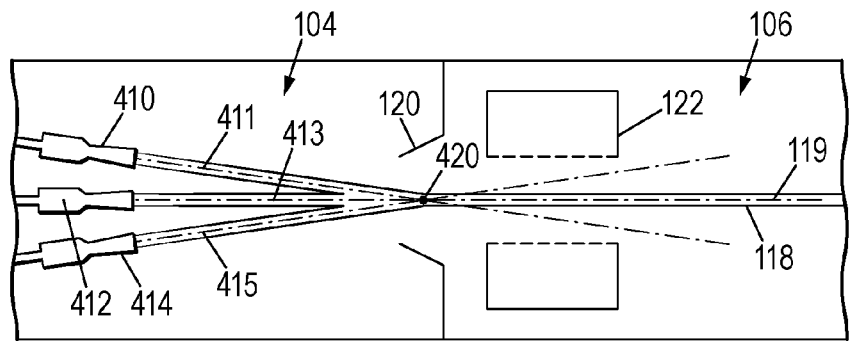
Figure 13D:
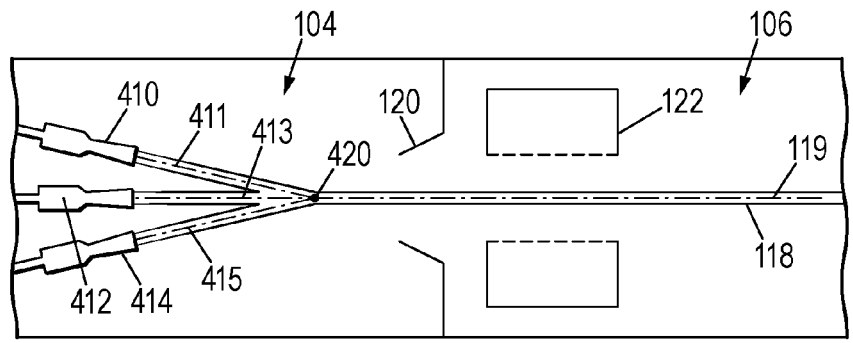

Furthermore, as depicted in partial schematic view in FIGS. 13A-13D, to assist in gas cluster beam coalescence, the nozzles (three nozzles 410, 412, 414 are shown, but the invention is not so limited) can be mounted at a slight angle pointing towards a single intersecting point 420 along the beam axis 119 of gas cluster beam 118 of FIGS. 1, 2 and 3. For example, the gas cluster beam axes 411, 413, 415 of the individual nozzles 410, 412, 414 can intersect at a single intersecting point 420 along beam axis 119 inside the ionizer 122 (e.g., of GCIB processing system 100 of FIG. 1), as depicted in FIG. 13A. Alternatively, the gas cluster beam axes 411, 413, 415 of the individual nozzles 410, 412, 414 can intersect at a single intersecting point 420 along beam axis 119 downstream of the gas skimmer 120 but upstream of the ionizer 122, as depicted in FIG. 13B. In another alternative, the gas cluster beam axes 411, 413, 415 of the individual nozzles 410, 412, 414 can intersect at a single intersecting point 420 along beam axis 119 between an input and an output of the gas skimmer 120, as depicted in FIG. 13C. Alternatively yet, the gas cluster beam axes 411, 413, 415 of the individual nozzles 410, 412, 414 can intersect at a single intersecting point 420 along beam axis 119 between the output of the nozzles 410, 412, 414 and the input of the gas skimmer 120, as depicted in FIG. 13D. The inward slant angle, i.e. deviation from parallel orientation, can range from 0.5 to 10 degrees, or from 0.5 to 5 degrees, or from 1 to 2 degrees.

Figure 14:
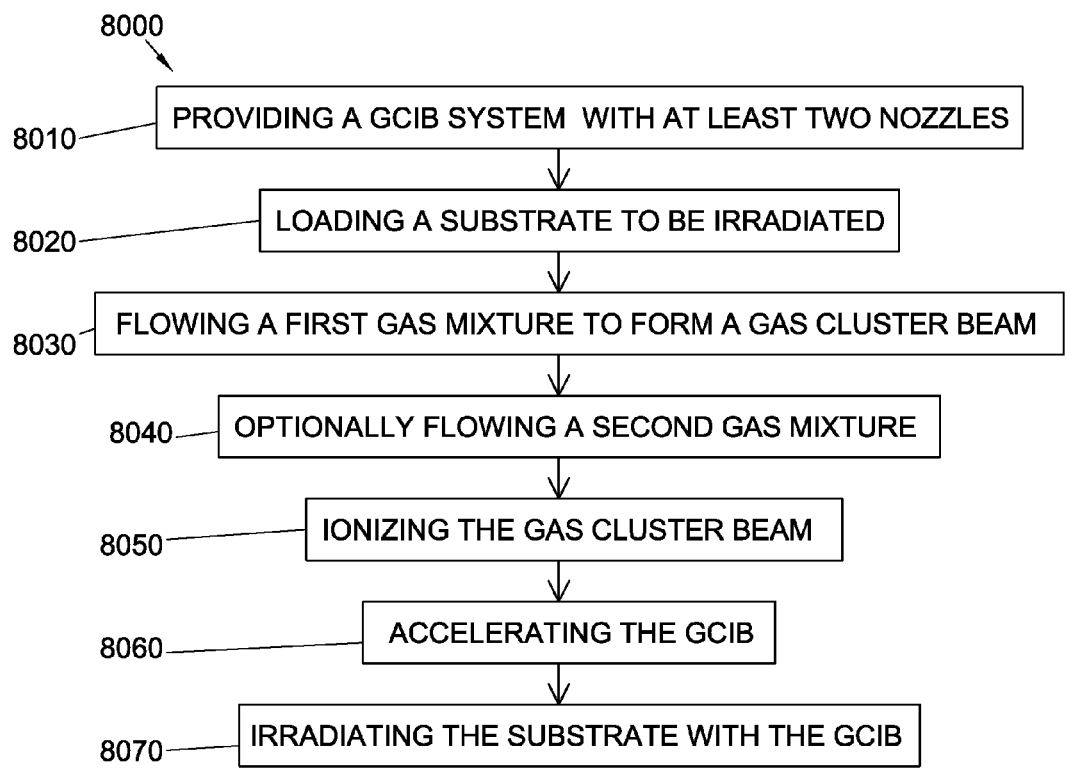
FIG. 14 is a flowchart of an embodiment of a method for operating a GCIB system with multiple nozzles.

Referring now to FIG. 14, a method of irradiating a substrate using a GCIB is illustrated according to an embodiment. The method comprises a flow chart 8000 beginning in 8010 with providing a GCIB processing system with a set of at least two nozzles either arranged in mutual close proximity to ensure coalescence of individual gas cluster beams before reaching a single gas skimmer or arranged so as to have intersecting beam axes, and a first gas supply configured to supply at least a subset of the full set of nozzles (e.g. a single nozzle, or multiple nozzles of the subset) with a gas mixture. The GCIB processing system can be any of the GCIB processing systems (100, 100' or 100") described above in FIG. 1, 2 or 3, or any combination thereof, with any arrangement of nozzles and gas supplies shown in FIGS. 5-13D.

In step 8020, a substrate is loaded into the GCIB processing system. The substrate can include a conductive material, a non-conductive material, or a semi-conductive material, or a combination of two or more thereof. Additionally, the substrate may include one or more material structures formed thereon, or the substrate may be a blanket substrate free of material structures. The substrate can be positioned in the GCIB processing system on a substrate holder and may be securely held by the substrate holder. The temperature of the substrate may or may not be controlled. For example, the substrate may be heated or cooled during a film forming process. The environment surrounding the substrate is maintained at a reduced pressure.

In step 8030, a flow of a first gas mixture is started from the first gas supply. The flow of gas through the nozzle, all nozzles, or subset of nozzles connected to the first gas supply forms a gas cluster beam or a coalesced and/or intersected gas cluster beam, which single beam passes through the single gas skimmer into the ionization chamber of the GCIB processing system.

In step 8040, an optional second gas mixture is introduced from an optional second gas supply into all or a subset of the remaining nozzles (i.e. nozzles not supplied by the first gas supply of step 8010, with the first gas mixture of step 8030). The optional second gas mixture may be the same or different than the first gas mixture, and the gas mixtures, if different, may be incompatible. Additionally, one of the gas mixtures may be pyrophoric. The optional second gas mixture also forms a gas cluster beam or beams that coalesces and/or intersects with the beam or beams from the first nozzle or subset of nozzles to form a single gas cluster beam.

In step 8050, the single gas cluster beam is ionized in an ionizer, such as, for example, ionizer 300 of FIG. 4, to form a gas cluster ion beam (GCIB). In step 8060, the GCIB is accelerated by applying a beam acceleration potential to the GCIB.

In step 8070, the GCIB composed of the first gas mixture, and the optional second gas mixture, is used to irradiate the substrate loaded in the GCIB processing system.

The beam acceleration potential and the beam dose can be selected to achieve the desired properties of a layer affected by irradiation with the GCIB, on the substrate. For example, the beam acceleration potential and the beam dose can be selected to control the desired thickness of a deposited or grown layer, or to achieve a desired surface roughness or other modification of an upper layer atop the substrate, or to control the concentration and depth of penetration of a dopant into the substrate. Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters irradiate the surface of the substrate per unit area (i.e., number of clusters per unit area per unit time) may be held constant while the time is varied to change the beam dose.

Additionally, other GCIB properties may be varied, including, but not limited to, gas flow rates, stagnation pressures, cluster size, or gas nozzle designs (such as nozzle throat diameter, nozzle length, and/or nozzle divergent section halfangle).

The selection of combinations of gases used for the first and optional second gas mixture depends on the process that the substrate is being subjected to. The deposition or growth of a material layer may include depositing or growing a $SiO_x$, $SiN_x$, $SiC_x$, $SiC_xO_y$, $SiC_xN_y$, $BN_x$, $BSi_xN_y$, Ge, SiGe(B), or SiC(P) layer on a substrate or atop an existing layer on a substrate. According to embodiments of the invention, the first or the optional second gas mixture may thus comprise a nitrogen-containing gas, a carbon-containing gas, a boron-containing gas, a silicon-containing gas, a phosphorous-containing gas, a sulfur-containing gas, a hydrogen-containing gas, a silicon-containing gas, or a germanium-containing gas, or a combination of two or more thereof. Examples of gases which may be used to form the first and optional second gas mixture are: He, Ne, Ar, Kr, Xe, Rn, $SiH_4$, $Si_2H_6$, $C_4H_{12}Si$, $C_3H_{10}Si$, $H_3C$—$SiH_3$, $H_3C$—$SiH_2$—$CH_3$, $(CH_3)_3$—$SH$, $(CH_3)_4$—$Si$, $SiH_2Cl_2$, $SiCl_3H$, $SiCl_4$, $SiF_4$, $O_2$, CO, $CO_2$, $N_2$, NO, $NO_2$, $N_2O$, $NH_3$, $NF_3$, $B_2H_6$, alkyl silane, an alkane silane, an alkene silane, an alkyne silane, and $C_xH_y$, where $x \geq 1$, and $y \geq 4$, and combinations of two or more thereof. The first and optional second gas mixtures are formed by the first and optional second gas supplies of the GCIB processing system.

When depositing silicon, a substrate may be irradiated by a GCIB formed from a first or optional second gas mixture having a silicon-containing gas. For example, a gas mixture may comprise silane ($SiH_4$). In another example, the gas mixture may comprise disilane ($Si_2H_6$), dichlorosilane ($SiH_2Cl_2$), trichlorosilane ($SiCl_3H$), diethylsilane ($C_4H_{12}Si$), trimethylsilane ($C_3H_{10}Si$), silicon tetrachloride ($SiCl_4$), silicon tetrafluoride ($SiF_4$), or a combination of two or more thereof.

When depositing or growing an oxide such as $SiO_x$, a substrate may be irradiated by a GCIB formed from a first and optional second gas mixture having a silicon-containing gas and an oxygen-containing gas, respectively. For example, the first gas mixture may comprise silane ($SiH_4$), and the second gas mixture may comprise $O_2$. In another example, the second gas mixture may comprise $O_2$, CO, $CO_2$, NO, $NO_2$, or $N_2O$, or any combination of two or more thereof.

When depositing or growing a nitride such as $SiN_x$, a substrate may be irradiated by a GCIB formed from a first and optional second gas mixture having a silicon-containing gas and a nitrogen-containing gas, respectively. For example, the first gas mixture may comprise silane ($SiH_4$), and the second gas mixture may comprise $N_2$. In another example, the second gas mixture may comprise $N_2$, NO, $NO_2$, $N_2O$, or $NH_3$, or any combination of two or more thereof.

When depositing a carbide such as $SiC_x$, a substrate may be irradiated by a GCIB formed from a pressurized gas mixture having a silicon-containing gas and a carbon-containing gas. For example, the first gas mixture may comprise silane ($SiH_4$) and $CH_4$. Alternatively, the first gas mixture may comprise silane ($SiH_4$) only, and the optional second gas mixture may comprise $CH_4$. Additionally, for example, the first gas mixture may comprise silane ($SiH_4$), and the optional second gas mixture may comprise methylsilane ($H_3C$—$SiH_3$). Furthermore, for example, the first gas mixture may comprise a silicon-containing gas and $CH_4$ (or more generally a hydrocarbon gas, i.e., $C_xH_y$), and the optional second gas mixture may comprise CO, or $CO_2$. Further yet, any of the first gas mixture and optional second gas mixture may comprise, for example, alkyl silane, an alkane silane, an alkene silane, or an alkyne silane, or any combination of two or more thereof. Additionally, for example, the first gas mixture may comprise silane, methylsilane ($H_3C$—$SiH_3$), dimethylsilane ($H_3C$—$SiH_2$—$CH_3$), trimethylsilane (($CH_3$)$_3$—SiH), or tetramethylsilane (($CH_3$)$_4$—Si), or any combination of two or more thereof. When growing or depositing a carbonitride such as $SiC_xN_y$, the optional second gas mixture may further comprise a nitrogen-containing gas. For example, the nitrogen-containing gas may include $N_2$, $NH_3$, $NF_3$, NO, $N_2O$, or $NO_2$, or a combination of two or more thereof. The addition of a nitrogen-containing gas may permit forming a silicon carbonitride film (SiCN).

When growing or depositing a nitride such as $BN_x$, a substrate may be irradiated by a GCIB formed from a first gas mixture having a boron-containing gas and an optional second gas mixture having a nitrogen-containing gas. For example, the first gas mixture may comprise diborane ($B_2H_6$), and the optional second gas mixture may comprise $N_2$. In another example, the optional second gas mixture may comprise $N_2$, NO, $NO_2$, $N_2O$, or $NH_3$, or any combination of two or more thereof.

When growing or depositing a nitride such as $BSi_xN_y$, a substrate may be irradiated by a GCIB formed from a first gas mixture having a silicon-containing gas and a optional second gas mixture having a boron-containing gas and a nitrogen-containing gas. For example, the first gas mixture may comprise silane ($SiH_4$), and the optional second gas mixture may comprise diborane ($B_2H_6$) and $N_2$. In another example, the optional second gas mixture may comprise $B_2H_6$, $N_2$, NO, $NO_2$, $N_2O$, or $NH_3$, or any combination of two or more thereof.

In other processes, such as for example, infusion, doping, and layer surface modification, in addition to layer growth and deposition, further additional gases may be used to form gas mixtures in gas supplies of a GCIB processing system. These gases include germanium-, phosphorus-, and arsenic-containing gases, such as $GeH_4$, $Ge_2H_6$, $GeH_2Cl_2$, $GeCl_3H$, methylgermane, dimethylgermane, trimethylgermane, tetramethylgermane, ethylgermane, diethylgermane, triethylgermane, tetraethylgermane, $GeCl_4$, $GeF_4$, $BF_3$, $AsH_3$, $AsF_5$, $PH_3$, $PF_3$, $PCl_5$, or $PF_5$, or any combination of two or more thereof.

In any one of the above examples, the first and/or second gas mixture may comprise an optional inert dilution gas. The dilution gas may comprise a noble gas, such as for example, He, Ne, Ar, Kr, Xe, or Rn, which may be different for the first and second gas mixtures. Further extending the above process, optional third, fourth, etc., gas mixtures may be introduced (not shown), as the process may require, and if the number of available gas supplies and nozzles installed in the GCIB system, permits.

The inventors have tested the multiple nozzle GCIB system in a $SiO_2$ deposition process, which may be utilized for blanket $SiO_2$ deposition, or trench filling, such as shallow trench isolation (STI) structure filling. A similar process may be employed also for growth of a $SiO_2$ film. The hardware comprised a dual nozzle GCIB system configured with a pressure cell chamber, as in FIG. 3, with two gas supplies. The gas supply configuration of the GCIB system was that of FIG. 6. Each gas supply was configured with two gas sources: a first gas source for the process gas, and a second gas source for a dilution gas. The nozzle configuration used was that depicted in FIG. 10A, with nozzles mounted one above the other, and with a gas skimmer of circular cross section. All other components of the GCIB system were that of a single nozzle, single gas supply GCIB system.

To deposit $SiO_2$ on a substrate, the first gas supply was configured to flow $SiH_4$ as a Si-containing gas, which was diluted with He to form a first gas mixture fed into the first nozzle. The total flow rate through the first nozzle was set within the range of 300 to 700 sccm, typically 600 sccm, but the flow rate in a production process may be higher or lower than the above range, e.g. 200 to 1000 sccm. The percentage of $SiH_4$ in He, in the first gas mixture, was typically set at 10%, but in a production process it may be set higher or lower than 10%, e.g. at 2 to 20%. The second gas supply was configured to flow $O_2$ as an O-containing gas, through the second nozzle, at a flow rate ranging from 200 to 500 sccm, and optionally diluted with an additional flow of He ranging from 800 to 1100 sccm, to form a second gas mixture. In an actual production process, the flow rates of $O_2$ and the optional dilution gas may be different. The above flow rate ranges for the two gas mixtures translate into an $O_2/SiH_4$ ratio ranging from 3.3 to 16.7, which in part determines the $SiO_2$ film stoichiometry.

Deposition processes were run with the above two gas mixtures, with acceleration potentials $V_{Acc}$ ranging from 10 to 50 kV. The gas flow rate into the pressure cell chamber was either zero (i.e. off), or set at 20 sccm ("20P"), which translates into a pressure-distance integral of about 0.003 Torr-cm. The GCIB beam current under these conditions ranged from 15 to 49 µA.

Deposited $SiO_2$ films ranged in color from brown to very slightly tinted or colorless, with increasing $O_2/SiH_4$ ratio. All films showed evidence of compressive stress in acquired FTIR spectra, which is a common feature of most as-deposited GCIB films. The compressive stress can be reduced or eliminated using a post-deposition anneal process, at a temperature ranging from 600 to 1000 degrees C., and of 15 to 60 min duration, for example. The anneal process also causes the film roughness $R_a$ to decrease from as-deposited values of 6.9 Å to 7.4 Å, which depend weakly on the GCIB process condition, by about 0.3 Å $R_a$. Gap fill experiments were also conducted, in which trenches were successfully filled with $SiO_2$ before trench pinch-off.

Figure 15:
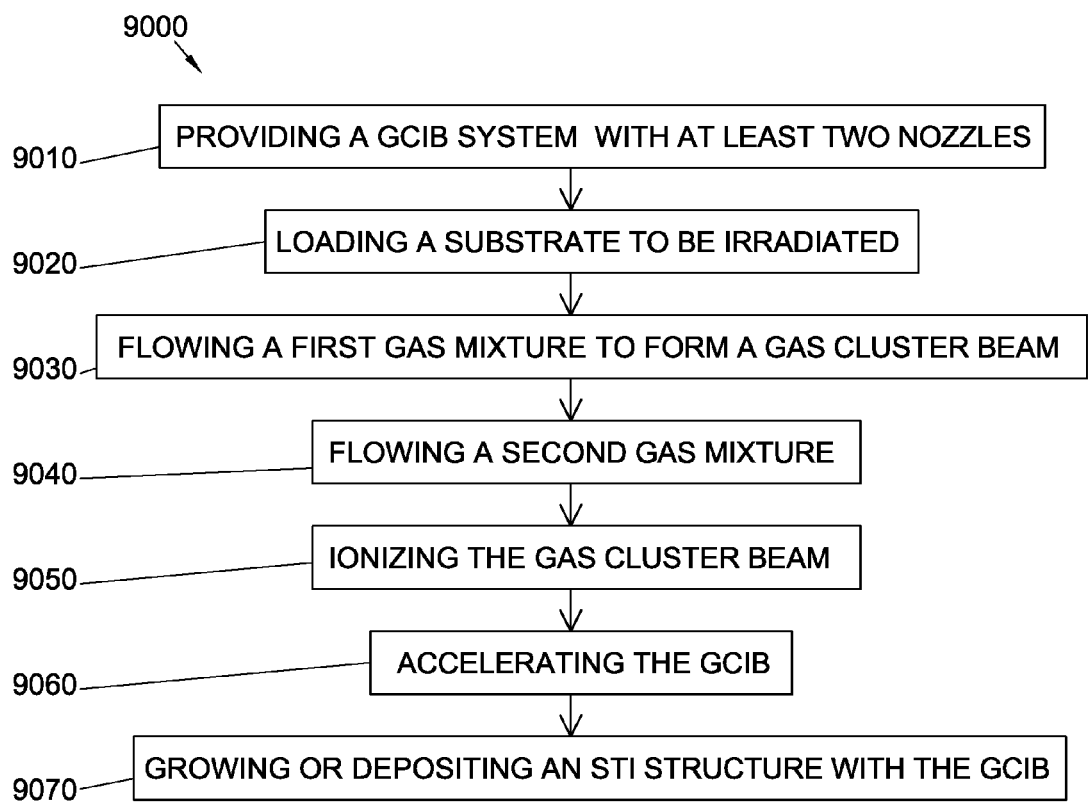
FIG. 15 is a flowchart of an embodiment of a method for formation of a shallow trench isolation (STI) structure using a GCIB system with multiple nozzles.

The flowchart in FIG. 15 shows the steps of a process 9000 of formation of a shallow trench isolation (STI) structure using a GCIB system with multiple nozzle and gas supplies. The process of forming an STI using a conventional single nozzle GCIB processing system is discussed in U.S. Provisional Patent Application No. 61/149,917, entitled "METHOD FOR FORMING TRENCH ISOLATION USING GAS CLUSTER ION BEAM PROCESSING" (Ref. No. EP-169 PROV), the entire content of which is herein incorporated by reference in its entirety.

The method begins with step 9010, with providing a GCIB processing system with a set of at least two nozzles either arranged in mutual close proximity to ensure coalescence of individual gas cluster beams before reaching a single gas skimmer or arranged so as to have intersecting beam axes, a first gas supply configured to supply a subset of the full set of nozzles (e.g. a single nozzle, or multiple nozzles of the subset) with a gas mixture, and a second gas supply to supply the remaining nozzles (i.e. nozzles not supplied by the first gas supply). The GCIB processing system can be any of the GCIB processing systems (100, 100' or 100") described above in FIG. 1, 2 or 3, with any arrangement of nozzles and gas supplies shown in FIGS. 5-13D.

In step 9020, a substrate is loaded into the GCIB processing system. The substrate can include a conductive material, a non-conductive material, or a semi-conductive material, or a combination of two or more materials thereof. Additionally, the substrate may include one or more material structures formed thereon, or the substrate may be a blanket substrate free of material structures. The substrate can be positioned in the GCIB processing system on a substrate holder and may be securely held by the substrate holder. The temperature of the substrate may or may not be controlled. For example, the substrate may be heated or cooled during a film forming process. The environment surrounding the substrate is maintained at a reduced pressure.

In step 9030, a flow of a first gas mixture is started from the first gas supply. The flow of gas through the nozzle or subset of nozzles connected to the first gas supply forms a gas cluster beam which passes through the single gas skimmer into the ionization chamber of the GCIB processing system.

In step 9040, a second gas mixture is introduced from the second gas supply into all or a subset of the remaining nozzles (i.e. nozzles not supplied by the first gas supply) to form a gas cluster beam or beams that coalesces and/or intersects with the beam or beams from the first nozzle or subset of nozzles to form a single gas cluster beam.

In step 9050, the single gas cluster beam is ionized in an ionizer, such as, for example, ionizer 300 of FIG. 4, to form a gas cluster ion beam (GCIB). In step 9060, the GCIB is accelerated by applying a beam acceleration potential to the GCIB In step 9070, the GCIB composed of the first gas mixture and the second gas mixture is used to irradiate the substrate loaded in the GCIB processing system, to form an STI structure on the substrate, or on a layer atop the substrate. The STI structure can be used, for example, in a memory device.

To form an $SiO_2$ STI structure, i.e. to fill the STI trench with $SiO_2$, the first gas mixture may comprise a silicon-containing gas. For example, the first gas mixture may comprise $SiH_4$, $Si_2H_6$, $C_4H_{12}Si$, $C_3H_{10}Si$, $H_3C$—$SiH_3$, $H_3C$—$SiH_2$—$CH_3$, $(CH_3)_3$—$SiH$, $(CH_3)_4$—$Si$, $SiH_2Cl_2$, $SiCl_3H$, $SiCl_4$, $SiF_4$, alkyl silane, an alkane silane, an alkene silane, an alkyne silane, or any combination of two or more thereof. Optionally, the first gas mixture may further comprise an inert dilution gas. The dilution gas may comprise a noble gas, such as for example, He, Ne, Ar, Kr, Xe, or Rn. To form the STI structure, the second gas mixture may comprise an oxygen-containing gas. For example, the second gas mixture may comprise $O_2$, CO, $CO_2$, NO, $NO_2$, $N_2O$, or any combination of two or more thereof. Optionally, the second gas mixture may further comprise an inert dilution gas. The dilution gas may comprise a noble gas, such as for example, He, Ne, Ar, Kr, Xe, or Rn, or any combination of two or more thereof.

Figure 16:
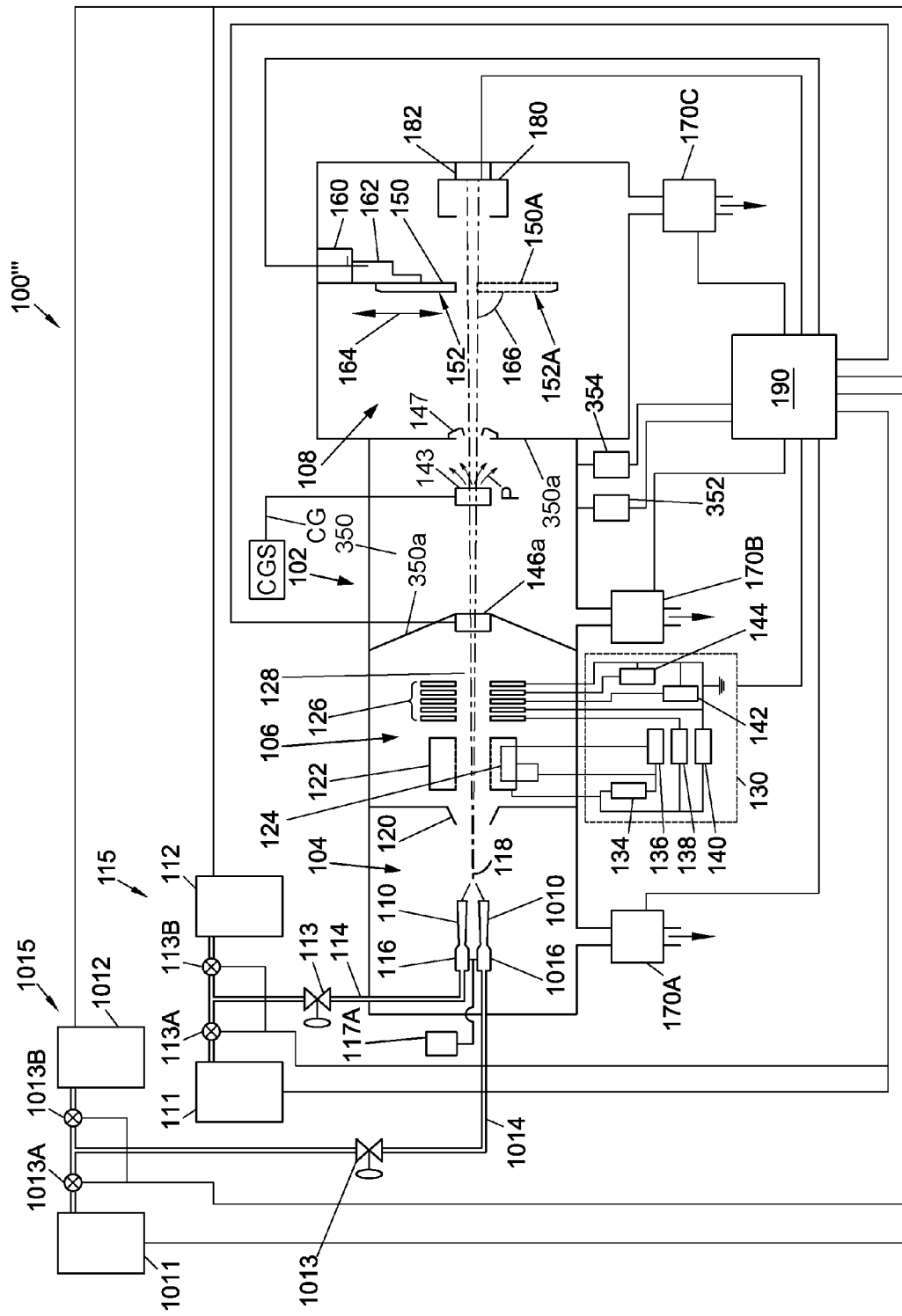
FIG. 16 is a schematic representation of a GCIB system including a plasma-generating apparatus, in accordance with an embodiment of the invention.

With reference to FIG. 16, an exemplary GCIB processing system 100''' is illustrated. For ease of understanding, like reference numerals in FIG. 16 refer to similar features in the preceding figures. The GCIB processing system 100''' has a cleaning feature for selectively cleaning the interior surfaces of the vacuum vessel 102. More specifically, the cleaning feature is in the form of a schematically depicted plasma generator 143 that selectively receives a cleaning gas CG from a suitably chosen gas supply CGS and selectively generates a plasma P, the emission of which is effective to clean such interior surfaces of vacuum vessel 102. The cleaning gas CG may, for example and without limitation, be a single gas or a combination of gases selected from the group consisting of $NF_2$, $N_2$, $NF_3$, Ar, $O_2$, $C_3F_8$, $CF_4$, and $C_2F_6$. Cleaning of the interior surfaces of vacuum vessel 102 with plasma P generated by the plasma generator 143 from one of these cleaning gases CG is carried out with a suitably chosen flow rate of the cleaning gas CG, such as between about 150 to about 200 sccm, and a suitably chosen power level, such as a power level in the range of about 150 to about 200 W, which may result in an etching rate in the range of about 100 Å/min to about 900 Å/min, for example.

Figure 17:
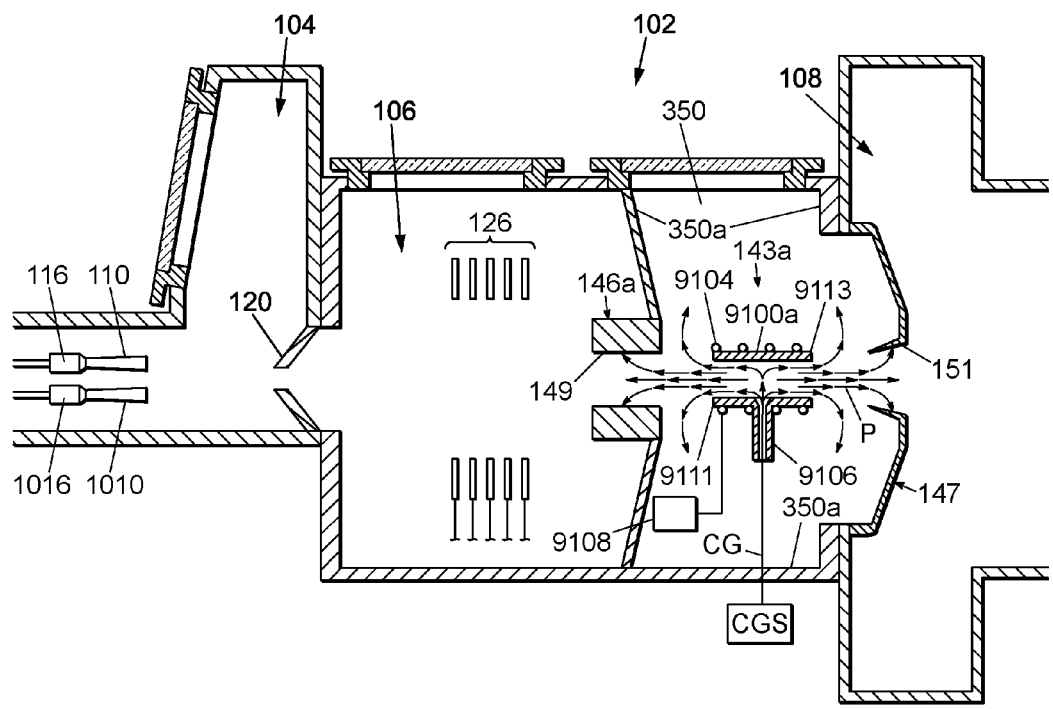
FIG. 17 is a schematic enlarged representation of an exemplary plasma-generating apparatus.
Figure 18:
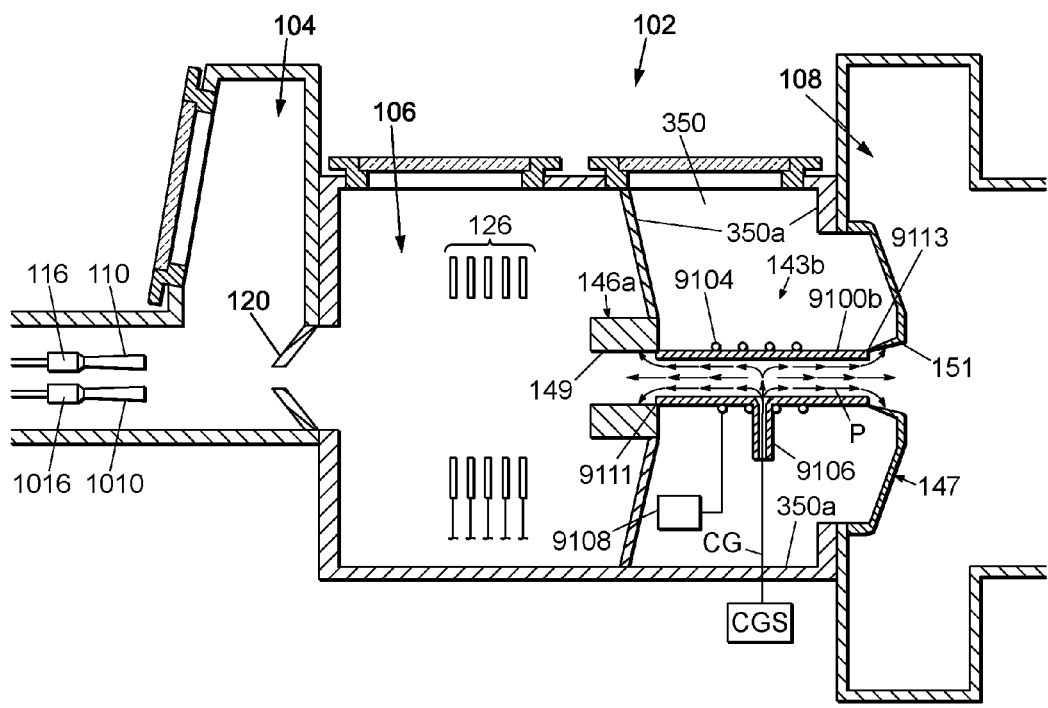
FIG. 18 is a schematic enlarged representation of another exemplary plasma-generating apparatus.

With reference to FIGS. 17 and 18, a pair of exemplary embodiments are illustrated, in which the plasma generator 143 (FIG. 16) is an inductively coupled plasma (ICP) generator. With particular reference to FIG. 17, an exemplary ICP generator 143a includes a tube 9100a made of a dielectric material such as quartz or alumina, and an induction coil 9104, such as a radio frequency (RF) coil, that surrounds (i.e., is wrapped around) the tube 9100a. The ICP generator 143a also includes a schematically-depicted RF generator 9108 that produces an oscillating RF current in the coil 9104.

In operation, the tube 9100a receives the cleaning gas CG in the interior of the tube 9100a through a side port 9106, and the RF generator 9108 is actuated to generate the RF current, which flows along the coil 9104. The flow of the RF current in the coil generates an RF magnetic field, which in turn excites the molecules of the cleaning gas CG in the interior of the tube 9100a, more specifically setting up an oscillating current in the ions and electrons of the cleaning gas CG in the interior of the tube 9100a. Collisions of the electrons and ions with other atoms of the cleaning gas CG results in the generation of the plasma P, which is emitted through one or both of the longitudinal end openings 9111, 9113 of the tube 9100a. To this end, the RF generator 9108 is suitably chosen to generate the desired magnitude of the RF magnetic field required to excite the cleaning gas molecules and may, for example, have a power rating of 0.5-5 kW and emit an RF current with a frequency of 13.56 or 27 MHz, for example.

With continued reference to FIG. 17, the tube 9100a of the exemplary ICP generator 143a is positioned between a magnetic beam filter 146a, which may be the same as or similar to beam filter 146 in the preceding figures, and an optional collimator 147 of the processing system 100''' located between the pressure cell chamber 350 and the processing chamber 108 within which the substrate 152 is supported (FIG. 16). The collimator 147 is configured to narrow the modified processing GCIB 128A' emitted by the one or more nozzles 110, 1010 and modified by the pressure cell chamber 350 of the GCIB processing system 100''' (FIG. 16). The length of the tube 9100a in the illustrated embodiment is such that it does not extend into either of a central opening 149 of the magnetic beam filter 146a or a central opening 151 of the collimator 147. Accordingly, the longitudinal end openings are spaced from but are located proximate both the magnetic beam filter 146a and the collimator 147.

In the illustrated embodiment, the plasma P generated by the ICP generator 143a is emitted through both of the longitudinal end openings 9111, 9113 of the tube 9100a and is effective to engage the surfaces defining the central opening 149 of the magnetic beam filter 146a and those defining the central opening 151 of the collimator 147. Engagement of the plasma P or reactive atoms and molecules emitted by the ICP plasma generator 143a with these surfaces results in removal of contamination collected on those surfaces during substrate (e.g., wafer) processing. Contamination may result, for example, by the diverging GCIB striking the different surfaces within vacuum vessel 102, which may cause deposition on those surfaces and potentially flake-off, thereby potentially contaminating substrate (e.g., wafer) processing if not removed. In this embodiment, the spaced location of the tube 9100a may permit the plasma P emitted by one or both of the longitudinal end openings 9111, 9113 to reach and thereby remove accumulated contamination from other surfaces within vacuum vessel 102 (i.e., surfaces other than those defining the central openings 149, 151).

With particular reference to FIG. 18, another exemplary embodiment of an ICP generator 143b includes a tube 9100b that is also positioned between the magnetic beam filter 146a and the collimator 147. In contrast to the embodiment of FIG. 17, the tube 9100b is not spaced from either the magnetic beam filter 146a or the collimator 147, but instead extends into both of the central openings 149, 151 of the magnetic beam filter 146a and collimator 147, respectively. More specifically, the longitudinal end openings 9111, 9113 are respectively positioned within the central openings 149, 151. The plasma P generated in the interior of the tube 9100b is directed through the central openings 149, 151, and is effective to clean the surfaces defining such central openings 149, 151. While not shown, this embodiment may include respective seals between the longitudinal end openings 9111, 9113 and the central openings 149, 151. Such seals restrict the engagement of the plasma P emitted by ICP generator 143b to the surfaces defining the central openings 149, 151, thus avoiding engagement of the plasma P with other adjacent surfaces within vacuum vessel 102. Other aspects of the structure and operation of ICP generator 143b are similar to those of the ICP generator 143a of FIG. 17, with like numbers in FIG. 18 referring to similar features of FIG. 17.

Generally referring now to FIGS. 17 and 18, alternative embodiments are contemplated in which the tube 9100a, 9100b is spaced from only one of the magnetic beam filter 146a or the collimator 147, and which accordingly has only one of the longitudinal end openings 9111, 9113 positioned within one of the central openings 149, 151, while the other of the openings 9111, 9113 is spaced from the other of the central openings 149, 151. In yet another embodiment, the tube 9100a, 9100b may be such that plasma P is emitted only through one of the longitudinal end openings 9111, 9113, with the plasma P being directed at surfaces adjacent that one of the longitudinal end openings 9111, 9113, rather than being directed at surfaces adjacent both longitudinal end openings 9111, 9113. In such embodiment also, the cleaning gas CG may be received through the other of the longitudinal end openings 9111, 9113 (i.e., the non-plasma emitting end), rather than through a side port 9106. While not shown in FIG. 16, 17, or 18, those embodiments may additionally include a beam gate 148 (FIGS. 1-3) located upstream of and adjacent the collimator 147.

In the embodiments of FIGS. 17 and 18, the materials and structure making up the induction coil 9104 are suitably chosen according to the desired magnitude of the magnetic field to be generated. In this regard, the coil 9104 may be made of copper or aluminum, for example, and have an optional coating such as a ceramic coating (e.g., aluminum oxide—$Al_2O_3$) having a thickness of several millimeters. Moreover, the length of the coil 9104 may be chosen so as to attain a specific position and length relative to the length dimensions of the tube 9100a, 9100b. For example, and without limitation, the length of the coil 9104 may be such that it wraps around substantially the entire length of the tube 9100a, 9100b, which may be desirable in embodiments in which the tube 9100a, 9100b is configured to emit plasma through both of the longitudinal end openings 9111, 9113. In another aspect, the coil 9104 may have a cooling feature (not shown) for limiting the temperature reached by the coil 9104 or the tube 9100a, 9100b during operation. This cooling feature may, for example, be in the form of water or other coolant liquid (e.g., fluorinated high dielectric strength liquid, such as Fluorinert® or Galden®) flowing through the inside hollow of, or contacting the coil 9104. Alternatively, the water or coolant liquid can be made to flow and contact the tube 9100a, 9100b.

While the embodiments of FIGS. 17-18 include a plasma generator in the form of an ICP generator 143a, 143b located between the magnetic beam filter 146a and the collimator 147, these are intended to be illustrative rather than limiting. More specifically, it is contemplated that other types of plasma generators may instead be positioned or have structural relationships to adjacent components (e.g., the magnetic beam filter 146a and/or collimator 147) that are different from those illustrated in FIGS. 16-18. For example, and without limitation, another contemplated type of plasma generator that may be used includes a microwave plasma generator. Yet another contemplated type of plasma generator is a capacitively coupled plasma (CCP) generator, in which an electric field is generated across a space between a pair of metal electrodes (not shown), with the generated field exciting molecules of the cleaning gas CG flowing between the electrodes.

Likewise, alternative embodiments are contemplated in which an ICP generator 143a, 143b (FIGS. 17-18), or any other type of plasma generator 143 (FIG. 16), is located and/or has an orientation different from those illustrated with respect to the embodiments of FIGS. 16-18. Moreover, such alternative embodiments may include plasma generators of any type that are effective to remove contamination accumulated on surfaces within the vacuum vessel 102 other than the surfaces of the central openings 149, 151. In this regard, the illustrative ICP generator 143a of FIG. 17, for example, may be configured such that the plasma P generated by the ICP generator 143a is directed toward the interior wall surfaces 350a defining the pressure cell chamber 350, such that engagement of the plasma P with those wall surfaces 350a is effective to remove contamination accumulated on those surfaces 350a during substrate (e.g., wafer) processing.

Figure 19:
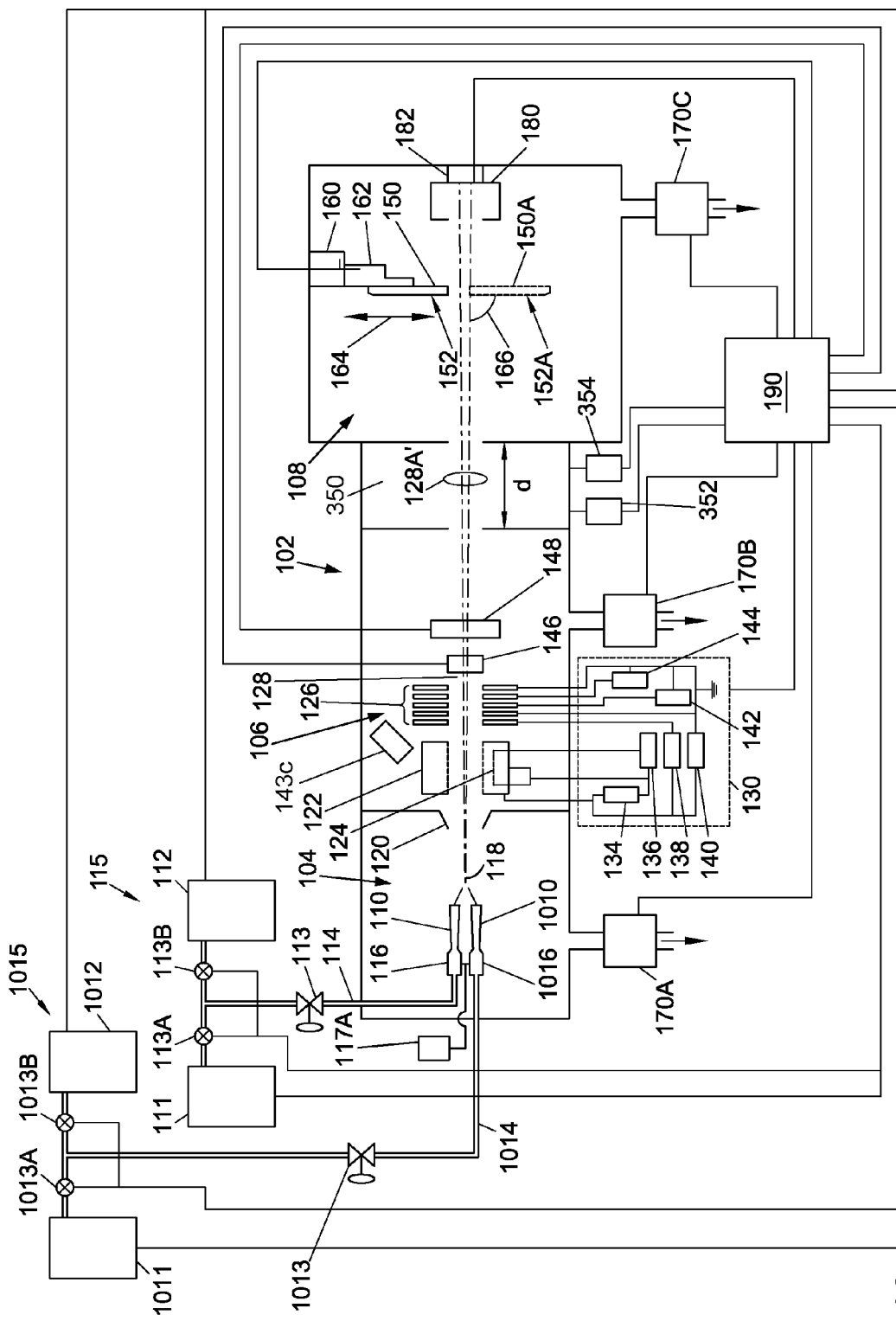
FIG. 19 is a schematic representation of a GCIB system including a plasma-generating apparatus, in accordance with another embodiment of the invention.
Figure 20:
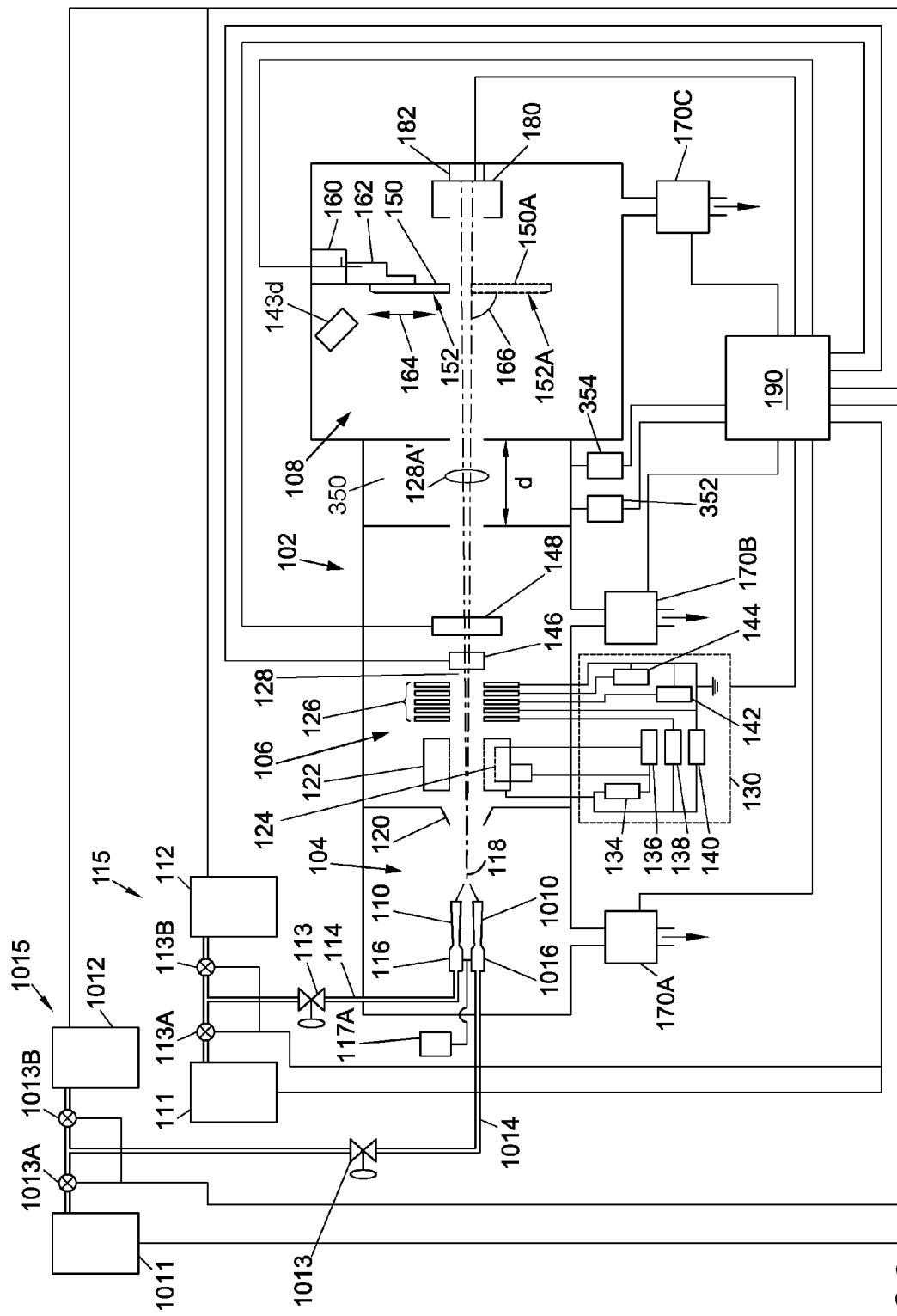
FIG. 20 is a schematic representation of yet another embodiment of a GCIB system including a plasma-generating apparatus, in accordance with another embodiment of the invention.
Figure 21:
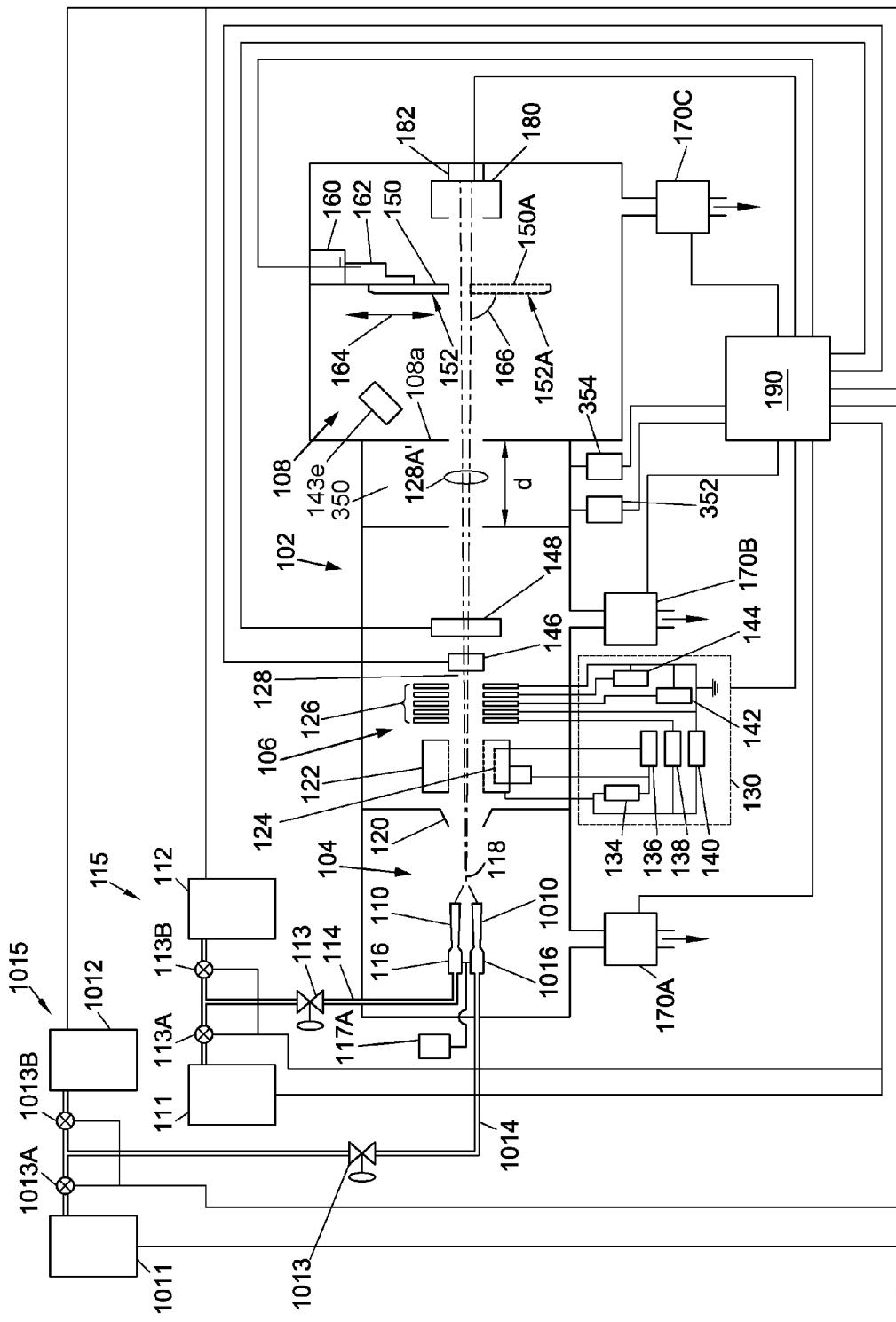
FIG. 21 is a schematic representation of a GCIB system including a plasma-generating apparatus, in accordance with another embodiment of the invention.

Other embodiments that are contemplated include plasma generators of any type that are effective to engage other surfaces within the vacuum vessel 102, and in particular, surfaces adjacent to or downstream of the ionizer 122. In this regard, and referring now to FIGS. 19, 20, and 21, respective plasma generators 143c, 143d, and 143e may be effective to engage surfaces defining the ionizing chamber 106, for cleaning the ionizer 122 and/or electrodes 126 (FIG. 19), surfaces defining the processing chamber 108, particularly the surfaces of the actuators 160, 162 (FIG. 20), or other surfaces defining the processing chamber 108, particularly one or more of the interior walls 108a (FIG. 21), for example.

Figure 22:
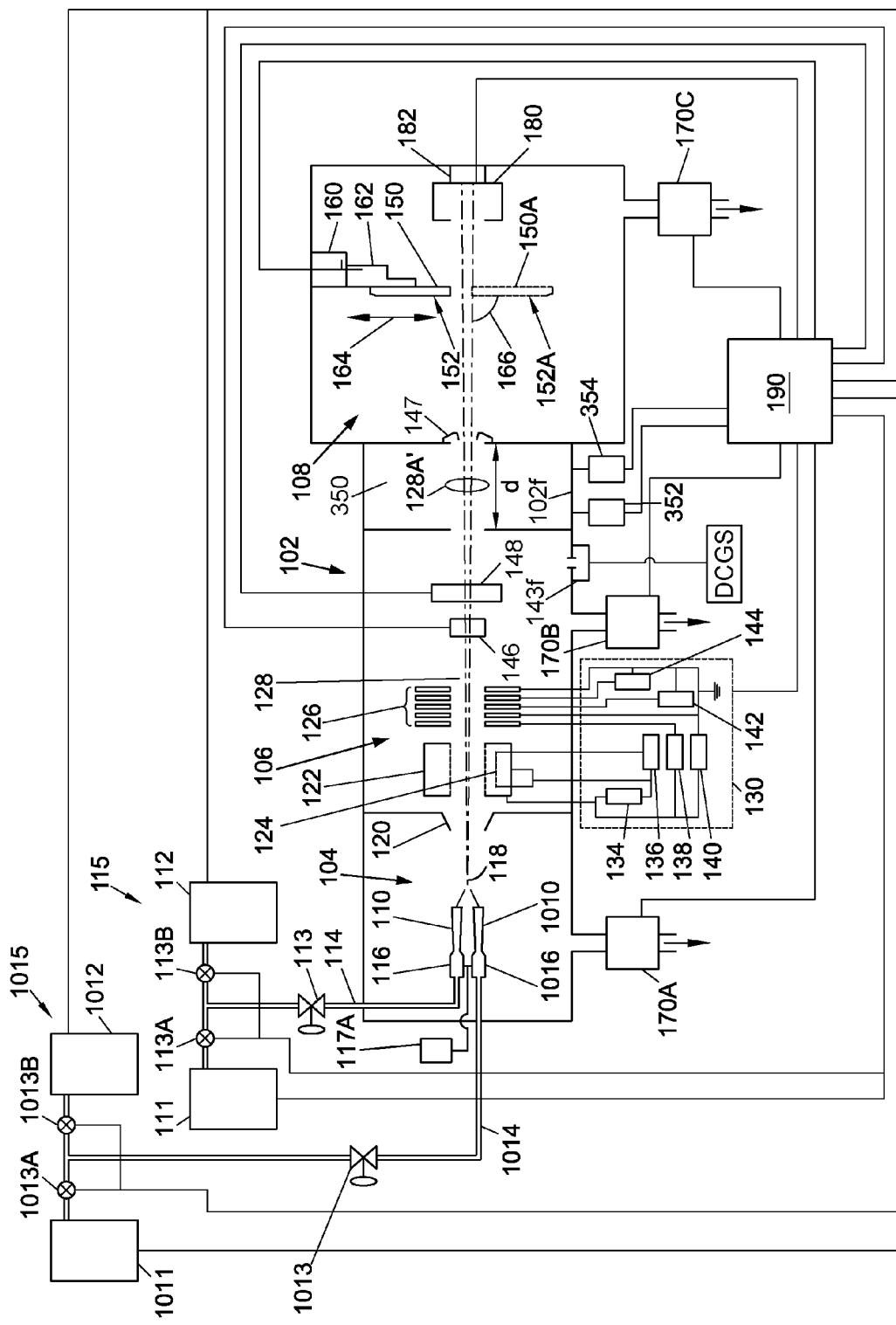
FIG. 22 is a schematic representation of yet another embodiment of a GCIB system including a plasma-generating apparatus, in accordance with yet another embodiment of the invention.

In another specific embodiment, illustrated in FIG. 22, a processing system 100'''' includes a remotely located plasma generator 143f, such as one of several remote plasma generators identified with one of model numbers AX7670, AX7685, AX7645, AX7640, or AX7635, and commercially available under the trade name Astron® from MKS Instruments, of Andover, Mass. The remote plasma generator 143f is in fluid communication with the interior of vacuum vessel 102 but may be located, for example, substantially outside of and adjacent a side wall 102f defining the vacuum vessel 102, as illustrated in that figure. The remote plasma generator 143f may be additionally configured to emit neutral fluorine atoms that are also effective to clean interior surfaces within vacuum vessel 102.

As discussed above, the plasma generator 143, 143a-f of any of the embodiments of FIGS. 16-22 receives cleaning gas CG from a cleaning gas supply CGS (FIGS. 17 and 18). To this end, the plasma generator 143, 143a-f may be in fluid communication, for example, with one or both of the same gas supplies 115, 1015 that supply gas to one or more of the nozzles 110, 1010. Alternatively, the plasma generator 143, 143a-f may instead be in fluid communication with a dedicated source of cleaning gas DOGS (FIG. 22) that is not in fluid communication with the one or more nozzles 110, 1010 i.e., it is free of fluid communication with the gas supplies 115, 1015 that supply processing gas to those nozzles 110, 1010.

Figure 23:
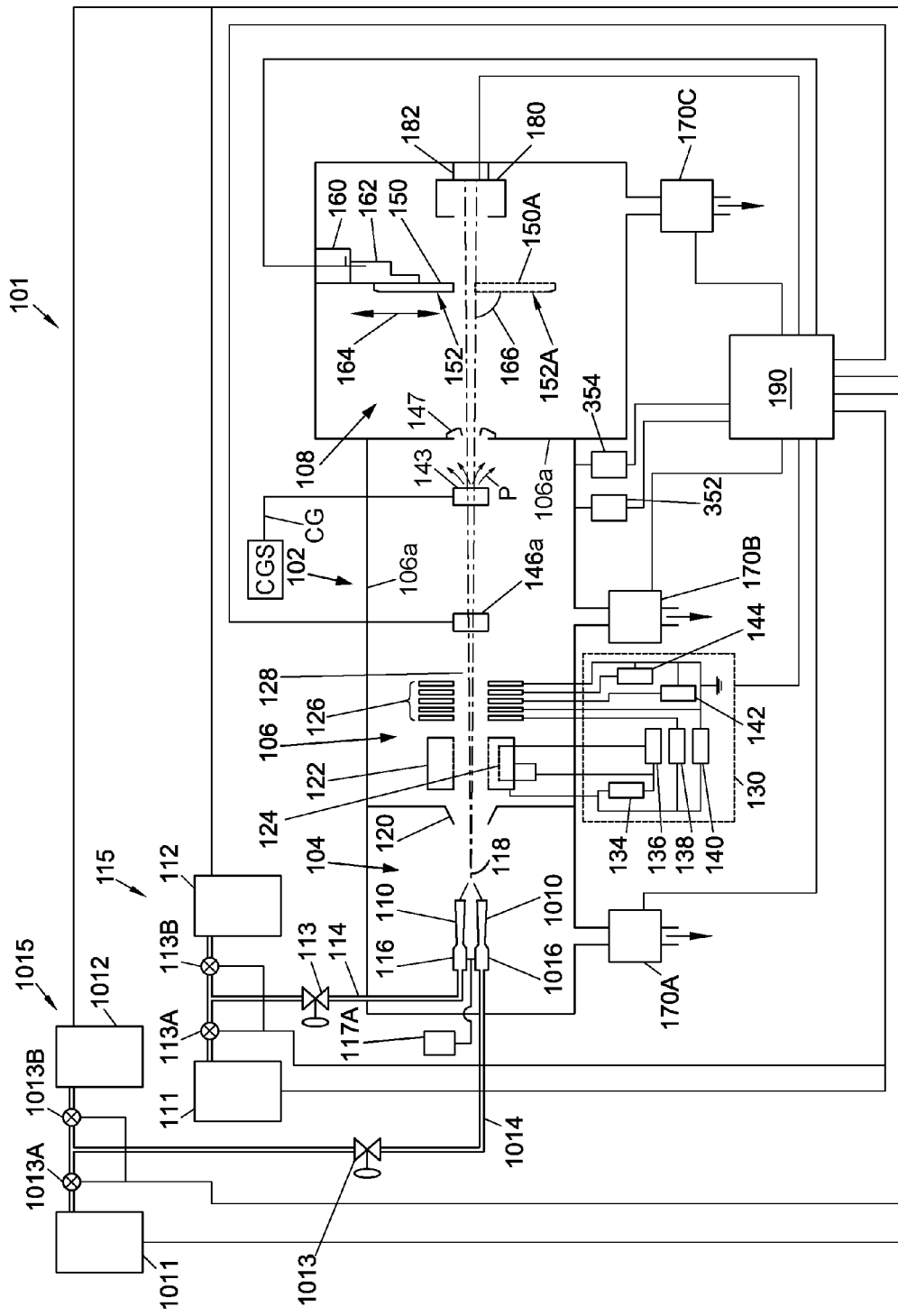
FIG. 23 is a schematic representation of another embodiment of a GCIB system that does not include a pressure cell chamber and which includes a plasma-generating apparatus similar to those of FIGS. 16-22.

With reference to FIG. 23, another embodiment of a GCIB processing system 101 is similar to the system 100''' of FIG. 16 but does not include a pressure cell chamber 350. The system 101 includes a plasma generator 143, which may take the form of the any of the exemplary plasma generators 143, 143a-f associated with the embodiments of FIGS. 16-22. In this regard, the description of the plasma generators 143, 143a-f of FIGS. 16-22 may be referred to for an understanding of the structure, function, and structural relationship to adjacent components of the plasma generator 143 of FIG. 23 as well. The plasma generator 143 of FIG. 23 is disposed within the ionization/acceleration chamber 106 and is configured to clean one or more interior surfaces 106a of the ionization/acceleration chamber 106 or surfaces of components of the GCIB processing system 101 that are also located within the ionization/acceleration chamber 106.

Figure 24:
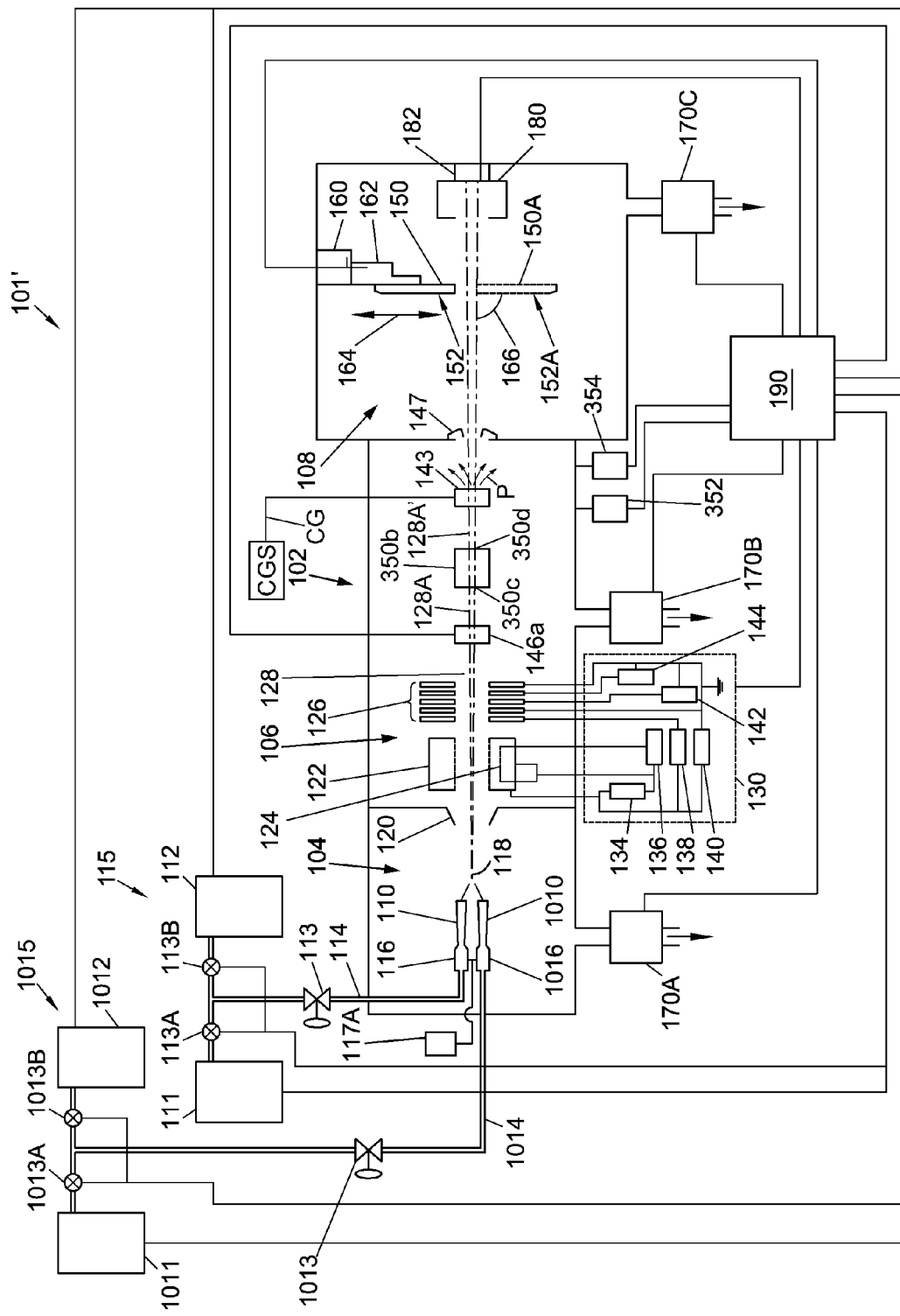
FIG. 24 is a schematic representation of another embodiment of a GCIB system that includes a pressure cell chamber different from the pressure cell chamber of FIGS. 16-22 and which includes a plasma-generating apparatus similar to those of FIGS. 16-22.

With reference to FIG. 24, another embodiment of a GCIB processing system 101' is similar to the system 100''' of FIG. 16 but includes a tubular pressure cell chamber 350b that is disposed within the ionization/acceleration chamber 106 and located between the magnetic beam filter 146a and the plasma generator 143. The pressure cell chamber 350b is configured to modify the energy distribution of the processing GCIB 128A. To this end, the pressure cell chamber 350b includes an inlet 350c and an outlet 350d, which respectively permit entry of the processing GCIB 128A and exit of the modified processing GCIB 128A'. The plasma generator 143 in this embodiment may take any of the forms of the plasma generators 143, 143a-f of FIGS. 16-22. In this regard, the description of the plasma generators 143, 143a-f of FIGS. 16-22 may be referred to for an understanding of the structure, function, and structural relationship to adjacent components of the plasma generator 143 of FIG. 24 as well.

Figure 25:
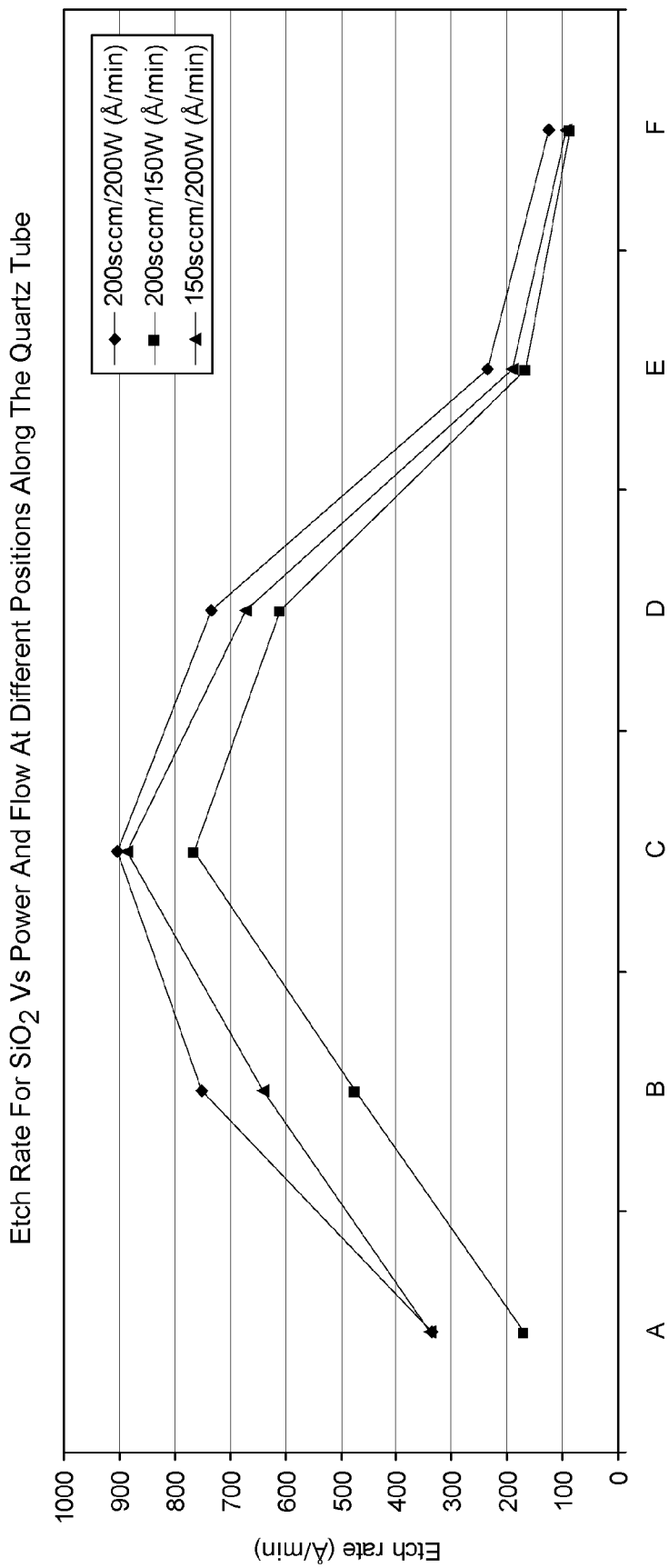
FIG. 25 is a graph showing results of different levels of etch rates achieved with an exemplary plasma generating apparatus.
Figure 25A:
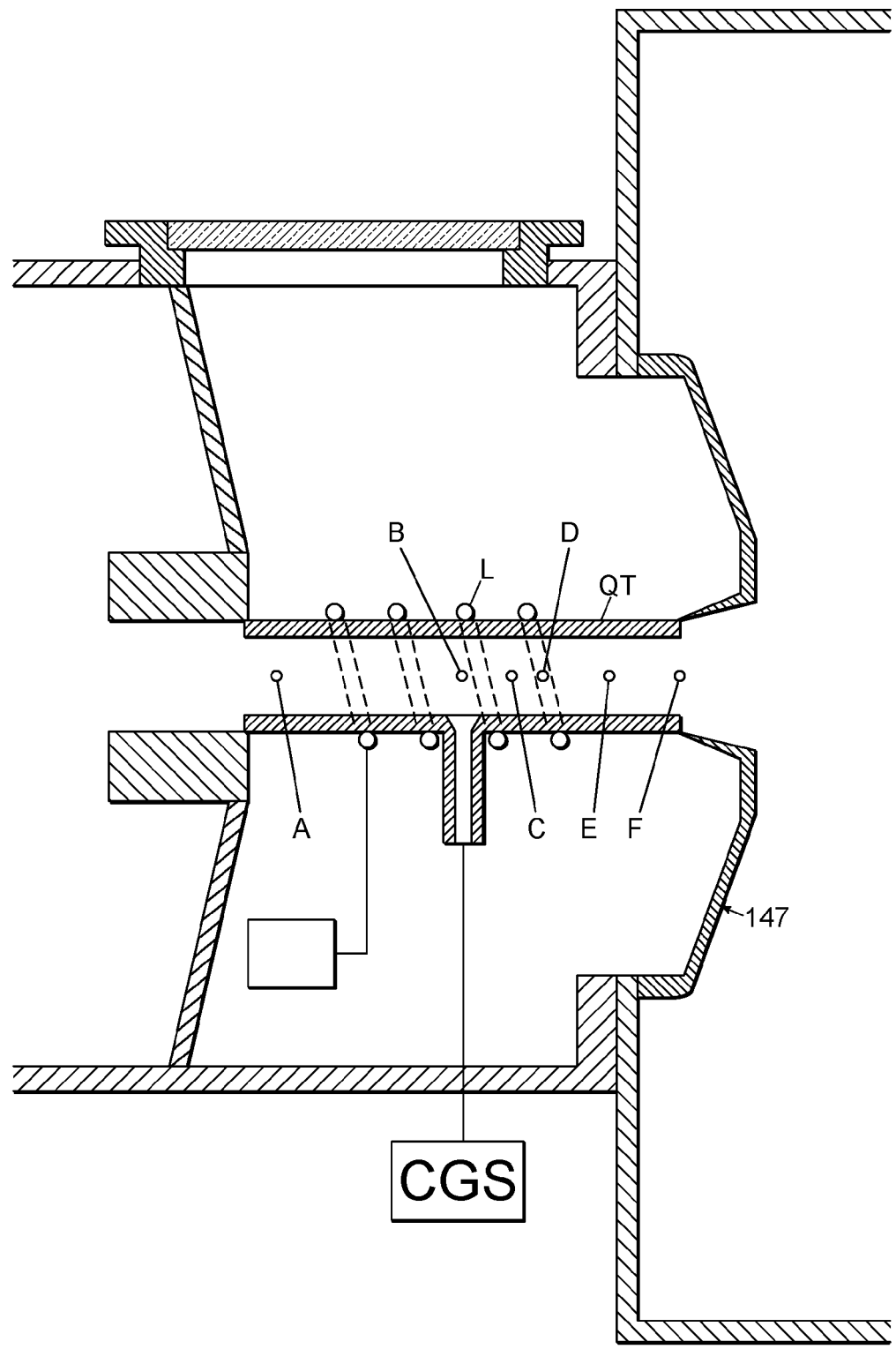
FIG. 25A is a schematic representation similar to FIG. 18 illustrating details associated with the graph of FIG. 25.

Referring now to FIGS. 25 and 25A, these figures illustrate exemplary levels of etching rate achieved with any of the plasma generators 143, 143a-f (FIGS. 16-24) depending on different control variables. The exemplary etching rate levels illustrated in FIG. 25 correspond to the etching rate on a $SiO_2$ sample with plasma generated with 10% $NF_2$ in $N_2$. The $SiO_2$ sample was placed at different locations, designated A through F (FIG. 25A), of the plasma generator. The plasma was generated within a quartz tube QT surrounded by a coil L, with the ends of the quartz tube QT being partially sealed off. The etching rate on the $SiO_2$ sample was then measured for different combinations of power levels and cleaning gas flow rate for the different locations A-F.

With particular reference to FIG. 25A, the location designated with the letter A corresponds to placement of the $SiO_2$ sample on the interior surface of the quartz tube QT, proximate the upstream end thereof. The location designated with the letter B corresponds to placement of the $SiO_2$ sample on the interior surface of the quartz tube QT substantially at the longitudinal center of the tube. The location designated with the letter C corresponds to placement of the $SiO_2$ sample on the interior surface of the quartz tube QT, downstream of the longitudinal center of the tube and in the space between adjacent turns of the coil L. The location designated with the letter D corresponds to placement of the $SiO_2$ sample on the interior surface of the quartz tube QT directly below one of the turns of the coil L and downstream from location C. The location designated with the letter E corresponds to placement of the $SiO_2$ sample on the interior surface of the quartz tube QT downstream of location D, and the location designated with the letter F corresponds to placement of the $SiO_2$ sample on the interior surface of the quartz tube QT substantially at the downstream end of the quartz tube QT.

With particular reference to FIG. 25, the data illustrate that etching rate increases with the power level applied to the coil L as well as with the flow rate of the cleaning gas used in the generation of the plasma. More specifically, regardless of the chosen location of the $SiO_2$ sample, the resulting etching rate was higher for a power level of 200 W than for a power level of 150 W while maintaining the cleaning gas flow rate constant at 200 sccm. In addition, and also regardless of the chosen location of the $SiO_2$ sample, the resulting etching rate was higher for a cleaning gas flow rate of 200 sccm than a flow rate of 150 sccm while maintaining the power level constant at 200 W. The data also illustrate the effect of the location of the $SiO_2$ sample along the quartz tube QT on the resulting etching rate. Specifically, the relatively more centralized locations B,C,D resulted in higher etching rates than the outer locations A, B, E, F. The etching rate at location F was about 100 Å/min or greater, which is believed to be indicative of the resulting etching rate on accumulated contamination on the surfaces of the collimator 147 in the embodiment of FIG. 18, for example.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations may have been described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. A processing system for irradiating a substrate with a gas cluster ion beam (GLIB), the system comprising:
    a vacuum vessel having an interior and configured to support the substrate therein;
    at least one nozzle for forming and emitting a gas cluster beam, and configured to direct the gas cluster beam within the vacuum vessel toward the substrate;
    an ionizer positioned in the interior, downstream of the at least one nozzle, for ionizing the gas cluster beam to form the GCIB;
    a main gas supply in fluid communication with the at least one nozzle for supplying gas thereto; and
    a plasma generating apparatus communicating with the interior of the vacuum vessel and configured to receive a cleaning gas to generate a plasma therefrom and to selectively emit the plasma for cleaning the interior of the vacuum vessel;
    wherein the plasma generating apparatus is an inductively coupled plasma generator including a dielectric tube configured to receive the cleaning gas and emit the plasma, and an induction coil extending around the dielectric tube, the induction coil being effective to excite molecules of the cleaning gas in the dielectric tube to thereby generate the plasma.

2. The system of claim 1, wherein the dielectric tube is a quartz tube and the induction coil is an RF coil.

3. The system of claim 1, further comprising:
    a pressure cell chamber in the interior of the vacuum vessel for modifying an energy distribution of the GCIB, the dielectric tube and the induction coil being located within the pressure cell chamber and positioned such that emission of the plasma from the dielectric tube is effective to clean an interior of the pressure cell chamber.

4. The system of claim 1, further comprising:
    a magnetic beam filter in the interior of the vacuum vessel for filtering the GCIB, the dielectric tube being positioned proximate the magnetic beam filter so that emission of the plasma from the dielectric tube is effective to clean surfaces of the magnetic beam filter.

5. The system of claim 1, further comprising:
    a collimator in the interior of the vacuum vessel for narrowing the GCIB, the dielectric tube being positioned proximate the collimator such that emission of the plasma from the dielectric tube is effective to clean surfaces of the collimator.

6. The system of claim 1, further comprising:
    a magnetic beam filter in the interior of the vacuum vessel for filtering the GCIB; and
    a collimator in the interior of the vacuum vessel for narrowing the GCIB, the dielectric tube being positioned between the magnetic beam filter and the collimator such that emission of the plasma by the dielectric tube is effective to clean surfaces of the magnetic beam filter and surfaces of the collimator.

7. The system of claim 1, wherein the plasma generating apparatus is in fluid communication with the main gas supply for receiving the cleaning gas therefrom.

8. The system of claim 1, further comprising:
    a dedicated gas supply free of fluid communication with the at least one nozzle and in fluid communication with the plasma generating apparatus, the plasma generating apparatus being configured to generate the plasma from the cleaning gas received from the dedicated gas supply.

9. The system of claim 1, wherein the plasma generating apparatus is located substantially outside the vacuum vessel and is fluidly coupled to the interior thereof.

10. A processing system for irradiating a substrate with a gas cluster ion beam (GCIB), the system comprising:
    a vacuum vessel having an interior and configured to support the substrate therein and having a pressure cell chamber for modifying an energy distribution of the GCIB;
    at least one nozzle for forming and emitting a gas cluster beam, and configured to direct the gas cluster beam within the vacuum vessel toward the substrate;
    an ionizer positioned in the interior, downstream of the at least one nozzle, for ionizing the gas cluster beam to form the GCIB;
    a gas supply in fluid communication with the at least one nozzle for supplying gas thereto; and
    an inductively coupled plasma (ICP) generator in communication with the pressure cell chamber, the ICP generator including a dielectric tube configured to receive a cleaning gas and to selectively emit a plasma, and an induction coil extending around the dielectric tube, the induction coil being effective to excite molecules of the cleaning gas in the dielectric tube to thereby generate the plasma, wherein emission of the plasma is effective to clean an interior of the pressure cell chamber and surfaces adjacent thereto.

11. A method of cleaning an interior of a vacuum vessel of a processing system for irradiating a substrate with a gas cluster ion beam (GCIB), the processing system including at least one nozzle for forming and emitting a gas cluster beam, and configured to direct the gas cluster beam within the vacuum vessel toward the substrate, and an ionizer positioned in the interior, downstream of the at least one nozzle, for ionizing the gas cluster beam to form the GCIB, the method comprising:
    supplying a cleaning gas to a plasma generating apparatus fluidly coupled to the interior;
    actuating the plasma generating apparatus to excite molecules of the cleaning gas supplied thereto and thereby generate a plasma; and
    directing the plasma generated by the plasma generating apparatus into the interior adjacent to or downstream of the ionizer such that the plasma is effective to clean the interior of the vacuum vessel;
    wherein the plasma generating apparatus includes a dielectric tube and an induction coil surrounding the dielectric tube, actuation of the plasma generating apparatus comprising directing a radio frequency along the induction coil to cause excitement of the molecules of the cleaning gas within the dielectric tube.

12. The method of claim 11, wherein the processing system includes a pressure cell chamber downstream of the ionizer in the interior of the vacuum vessel for modifying an energy distribution of the GCIB, the method further comprising:
    directing plasma emitted by the plasma generating apparatus into an interior of the pressure cell chamber for cleaning thereof.

13. The method of claim 11, wherein the processing system includes a magnetic beam filter downstream of the ionizer in the interior of the vacuum vessel for filtering the GCIB formed by the ionizer, the method further comprising:
    directing the plasma emitted by the plasma generating apparatus through the magnetic beam filter for cleaning of surfaces thereof.

14. The method of claim 13, wherein the processing system includes a collimator downstream of the magnetic beam filter for narrowing the GCIB formed by the ionizer, the method further comprising:
   directing the plasma emitted by the plasma generating apparatus through the collimator for cleaning of surfaces thereof.

15. The method of claim 11, wherein the processing system includes a main gas supply for supplying gas to the at least one nozzle, the method further comprising:
   selectively supplying the cleaning gas from the main gas supply to the plasma generating apparatus for generation of the plasma.

16. The method of claim 11, wherein the processing system includes a main gas supply for supplying gas to the at least one nozzle, the method further comprising:
   supplying the cleaning gas to the plasma generating apparatus from a dedicated gas supply for generation of the plasma, the dedicated gas supply being free of fluid communication with the main gas supply.

17. The method of claim 11, wherein supplying the cleaning gas comprises supplying a gas selected from the group consisting of $NF_2$, $N_2$, $NF_3$, Ar, $O_2$, $C_3F_8$, $CF_4$, and $C_2F_6$.

* * * * *